United States Patent
Nii et al.

(10) Patent No.: US 7,355,873 B2
(45) Date of Patent: Apr. 8, 2008

(54) HIGHLY INTEGRATED TERNARY SEMICONDUCTOR MEMORY DEVICE

(75) Inventors: Koji Nii, Tokyo (JP); Hideaki Abe, Tokyo (JP); Kazunari Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/480,908

(22) Filed: Jul. 6, 2006

(65) Prior Publication Data
US 2007/0008760 A1   Jan. 11, 2007

(30) Foreign Application Priority Data
Jul. 6, 2005   (JP)   ............... 2005-197656

(51) Int. Cl.
*G11C 15/00* (2006.01)
(52) U.S. Cl. ..................... 365/49; 365/205
(58) Field of Classification Search ........... 365/49, 365/205
See application file for complete search history.

(56) References Cited

U.S. PATENT DOCUMENTS

| | | | | |
|---|---|---|---|---|
| 2003/0227788 A1* | 12/2003 | Lien | | 365/49 |
| 2004/0114411 A1* | 6/2004 | Noda et al. | | 365/49 |
| 2004/0208034 A1* | 10/2004 | Lien | | 365/49 |
| 2005/0017284 A1* | 1/2005 | Amo et al. | | 257/301 |
| 2005/0024976 A1* | 2/2005 | Kang et al. | | 365/232 |
| 2005/0105315 A1* | 5/2005 | Shin et al. | | 365/49 |

FOREIGN PATENT DOCUMENTS

| JP | 2002-74964 A | 3/2002 |
|---|---|---|
| JP | 2003-141879 A | 5/2003 |
| JP | 2003-297953 A | 10/2003 |

* cited by examiner

*Primary Examiner*—Michael T Tran
(74) *Attorney, Agent, or Firm*—McDermott Will & Emery LLP

(57) ABSTRACT

A TCAM (ternary content addressable memory) cell array is provided with a search input node into which one bit of search data is inputted, a plurality of data input nodes into which a bit corresponding to one bit of search data is inputted, and a plurality of memory cells arranged in rows and columns. Each of the plurality of memory cells further includes a first cell storing one bit of said storage data, and a logical operation cell determining whether or not said search data and storage data match. A gate of a transistor forming each of a plurality of memory cells extends along the direction of said rows. Each of a plurality of wells in the region where the memory array is formed is formed so as to continue to a corresponding well of an adjacent memory cell in the direction of said columns.

9 Claims, 25 Drawing Sheets

|  | WL0 | WL1 | WL2~7 | BL0 | BL1 | SL0 | /SL0 | SL1 | /SL1 | ML |
|---|---|---|---|---|---|---|---|---|---|---|
| #0 AT THE TIME OF DATA WRITE | H | L | L | D0 | D1 | L | L | L | L | H |
| #0 AT THE TIME OF MASK DATA WRITE | L | H | L | MD0 | MD1 | L | L | L | L | H |
| AT THE TIME OF DATA SEARCH | L | L | L | H | H | SD0 | /SD0 | SD1 | /SD1 | OUT |

( OUT: MATCH = H
MISMATCH = L )

FIG.11

| | WL0 | WL1 | WL2~3 | BL0A | BL0B | BL1A | BL1B | SL0 | /SL0 | SL1 | /SL1 | ML |
|---|---|---|---|---|---|---|---|---|---|---|---|---|
| #0, #1 AT THE TIME OF DATA WRITE | H | L | L | D0#0 | D0#1 | D1#0 | D1#1 | L | L | L | L | H |
| #0, #1 AT THE TIME OF MASK DATA WRITE | L | H | L | MD0#0 | MD0#1 | MD1#0 | MD1#1 | L | L | L | L | H |
| AT THE TIME OF DATA SEARCH | L | L | L | H | H | H | H | SD0 | /SD0 | SD1 | /SD1 | OUT |

( OUT: MATCH = H  
MISMATCH = L )

HIGHLY INTEGRATED TERNARY SEMICONDUCTOR MEMORY DEVICE

BACKGROUND OF THE INVENTION

1. Field of the Invention

This invention relates to a semiconductor memory device, and in particular, to a ternary content addressable memory (TCAM).

2. Description of the Background Art

In recent years, demand for content addressable memories (CAM's) having an address searching function has been increasing as a result of spreading internet use. In particular, demand for ternary content addressable memory (TCAM) where three values 0, 1 and X can be held in one memory cell has been increasing. In many cases, such TCAM's are used in the field of SoC's (systems on chips), particularly for system LSI's for routers, network switches and the like.

FIG. 26 is a circuit diagram showing the configuration of a memory cell which is used in a conventional TCAM. This configuration is disclosed in Japanese Patent Laying-Open No. 2003-141879.

With reference to FIG. 26, in a CAM cell 568, data bit line pair BIT and BITN is shared by and connected to two data cells 546 and 548, and a word line WL1 is connected to data cell 546, and a word line WL2 is connected to data cell 548. A comparing circuit 550 compares the data held in data cells 546 and 548 with comparison data that is supplied via comparison data lines CMB and CMBN, and outputs the results of comparison to a match line ML.

In recent years, increase in the memory capacitance in TCAM's has been desired, and increased integration of TCAM's has been demanded. However, Japanese Patent Laying-Open No. 2003-141879 and other prior art documents do not show any concrete layout for TCAM cells.

SUMMARY OF THE INVENTION

An object of the present invention is to provide a highly integrated semiconductor memory device.

Another object of the present invention is to provide a semiconductor memory device of which the speed is higher.

In short, this invention provides a semiconductor memory device having a plurality of memory cells arranged in rows and columns, each memory cell being configured to hold information of two bits. Each of the plurality of memory cells includes: a first cell capable of holding information of one bit; a second cell capable of holding information of one bit and placed adjacent to the first cell in a direction of the columns; a bit line pair extending along the direction of the columns and connected to both of the first and second cells; first and second word lines extending along a direction of the rows and connected to the first and second cells, respectively; and a logical operation cell placed adjacent, in the direction of the rows, to both of the first and second cells extending along the direction of the columns, and outputting results based on search data and information held in the first and second cells. A gate of a transistor forming each of the plurality of memory cells extends along the direction of the rows. A region where each of the plurality of memory cells is formed includes a plurality of wells. Each of the plurality of wells is formed so as to continue to a corresponding well of an adjacent memory cell in the direction of the columns.

Another aspect of this invention provides a semiconductor memory device, including: a search input node into which one bit of search data is inputted; a plurality of data input nodes which are respectively provided for a plurality of storage data, and into which a bit corresponding to one bit of the search data is inputted; and a plurality of memory cells arranged in rows and columns. Each of the plurality of memory cells includes: a first cell storing one bit of the storage data; and a logical operation cell determining whether or not the search data and storage data match.

Accordingly, the main advantage of the present invention is that a high-performance semiconductor memory device can be realized with a reduced number of interconnection layers while increasing the degree of integration. In addition, another advantage of the present invention is that data input is completed at a high speed, enabling high speed operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a table for illustrating the operation of a memory cell according to the second embodiment;

DESCRIPTION OF THE PREFERRED EMBODIMENTS

In the following, the present invention is described in detail in reference to the drawings. Here, the same symbols are attached to the same or corresponding portions in the figures, and the descriptions thereof are not repeated.

First Embodiment

Figure 1:
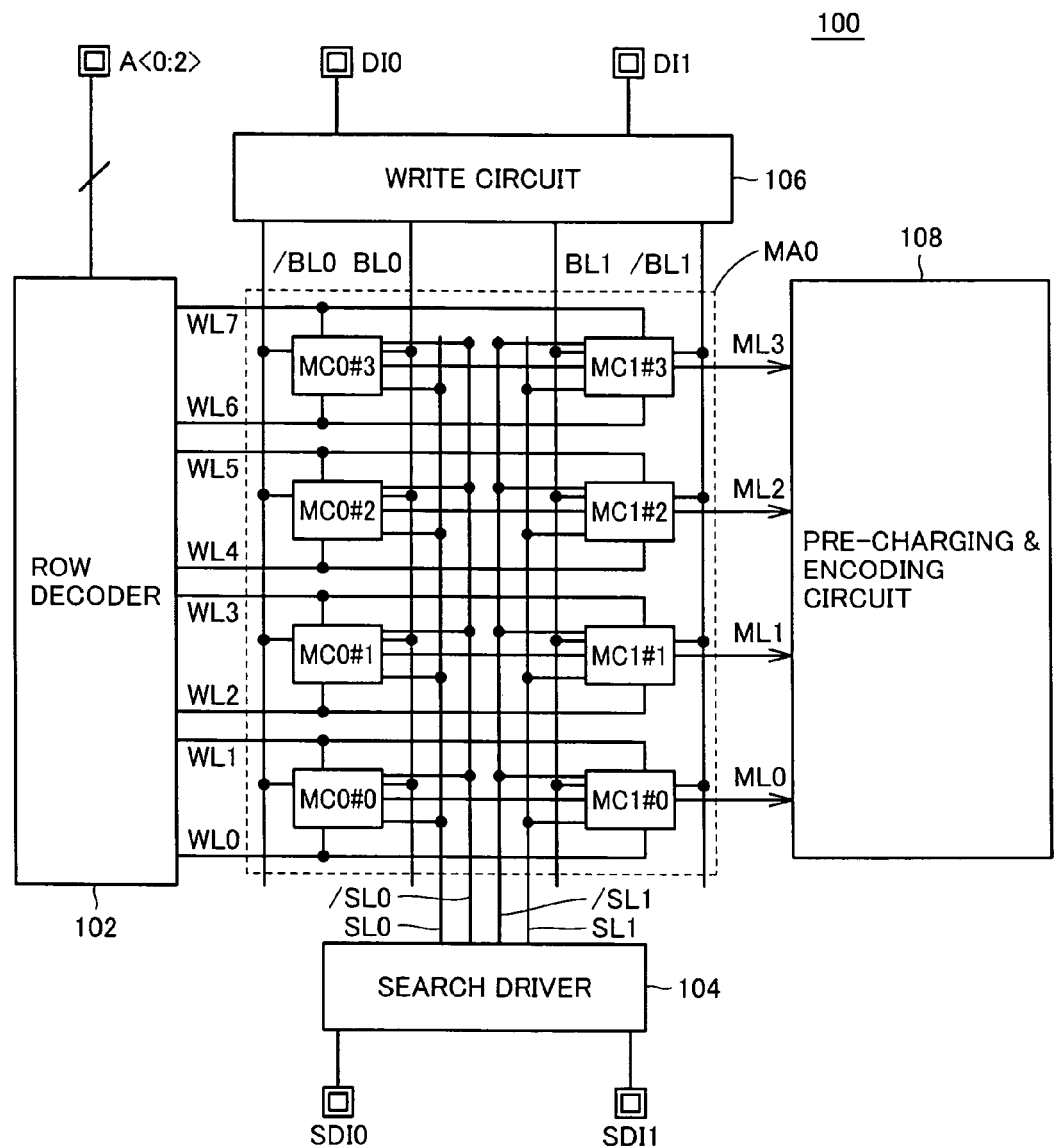
FIG. 1 is a block diagram schematically showing the configuration of a semiconductor memory device 100 according to a first embodiment.

FIG. 1 is a block diagram schematically showing the configuration of a semiconductor memory device 100 according to the first embodiment.

With reference to FIG. 1, semiconductor memory device 100 includes: a row decoder 102 receiving an address signal A<0:2> and activating word lines WL0 to WL7; a write circuit 106 driving bit lines BL0 and /BL0 in response to input data DI0, and driving bit line pair BL1 and /BL1 in response to input data signal DI1; a search driver 104 driving search line pair SL0 and /SL0 in response to a search data signal SDI0, and driving search line pair SL1 and /SL1 in response to a search data signal SDI1; a memory array MA0, to which word lines WL0 to WL7, bit line pairs BL0 and /BL0 as well as BL1 and /BL1, search line pairs SL0 and /SL0 as well as SL1 and /SL1, and match lines ML0 to ML3 are connected; and a pre-charging & encoding circuit 108 pre-charging match lines ML0 to ML3 and encoding the search results which are outputted to match lines ML0 to ML3.

In order to simplify the description, an example of memory array MA0 having an arrangement of two columns and four rows is shown. Memory array MA0 includes memory cells MC0#0 to MC0#3, which are aligned in the first column, and memory cells MC1#0 to MC1#3, which are aligned in the second column. Here, #0 to #3 are addresses that are referred to as entries. For example, #0 indicates an address number 0, and two TCAM cells, memory cells MC0#0 and MC1#0 are simultaneously accessed at the time of the data readout and write operations.

Each memory cell stores two bits, which are storage data and mask data. The storage data is data that becomes the object of being compared with the search data. The mask data is data for setting and determining whether or not the comparison is carried out for each bit.

Word lines WL0, WL2, WL4 and WL6 are word lines which are activated at the time of the readout and write of storage data. On the other hand, word lines WL1, WL3, WL5 and WL7 are word lines which are activated at the time of the readout and write of mask data.

Bit line pair BL0 and /BL0 as well as search line pair SL0 and /SL0 are shared by and connected to memory cells MC0#0 to MC0#3 in the first column. Bit line pair BL1 and /BL1 as well as search line pair SL1 and /SL1 are shared by and connected to memory cells MC1#0 to MC1#3 in the second column.

Word lines WL0 and WL1 as well as match line ML0 are shared by and connected to memory cells MC0#0 and MC1#0, which correspond to the first row, that is to say, address #0. In the same manner, word lines WL2 and WL3 as well as match line ML1 are shared by and connected to memory cells MC0#1 and MC1#1 in the second row. In addition, word lines WL4 and WL5 as well as match line ML2 are shared by and connected to memory cells MC0#2 and MC1#2 in the third row. Furthermore, word lines WL6 and WL7 as well as match line ML3 are shared by and connected to memory cells MC0#3 and MC1#3 in the fourth row.

Here, though FIG. 1 shows an example where search data SDI0 and SDI1, input data DI0 and DI1 as well as address signal A<0:2> are inputted from terminals, these may be provided from other blocks in the configuration in the case where such a CAM is incorporated in, for example, a system LSI. In addition, though the configuration concerning readout is not shown, a sense amplifier or the like is placed parallel to the write circuit so that the storage data that has been written and the mask data can be read out.

In addition, though the configuration of two columns is shown in order to simplify the description, the bit number per address can be increased by arranging columns in such a manner that these two columns are repeated as a unit.

Figure 2:
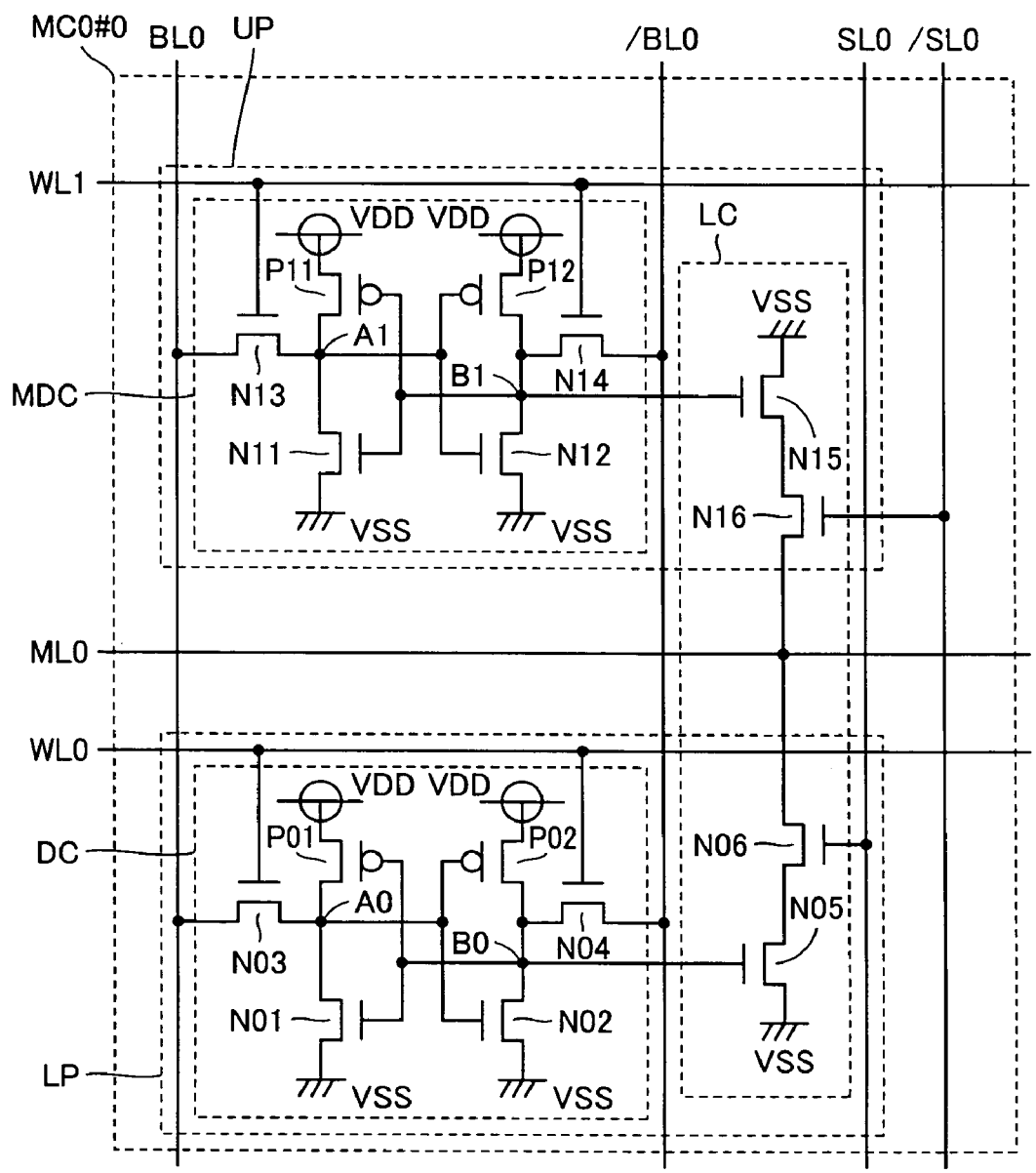
FIG. 2 is a circuit diagram showing the configuration of memory cell MC0#0 of FIG. 1.

FIG. 2 is a circuit diagram showing the configuration of memory cell MC0#0 of FIG. 1.

With reference to FIG. 2, memory cell MC0#0 includes a data cell DC capable of holding the storage data of one bit, and a mask data cell MDC capable of holding the mask bit information of one bit and is adjacent to data cell DC in the direction of the columns along the bit lines.

Memory cell MC0#0 further includes: bit line pair BL0 and /BL0, which extend along the direction of the columns and are connected to both data cell DC and mask data cell MDC; a word line WL0, which extends along the direction of the rows and is connected to data cell DC; a word line WL1, which extends along the direction of the rows and is connected to mask data cell MDC; and search line pair SL0 and /SL0, which extend parallel to bit line pair BL0 and /BL0 and transfer search data.

Memory cell MC0#0 further includes a match line ML0, which is parallel to the word lines, and a logical operation cell LC, which is placed adjacent to both data cell DC and mask data cell MDC in the direction of the rows and outputs the result corresponding to the search data and the information held in data cell DC and mask data cell MDC to match line ML0.

As described in detail in the following with reference to a layout diagram, a gate of a transistor forming each of the plurality of memory cells extends along the direction of the rows, and a region where each of the plurality of memory cells is formed includes a plurality of wells, and each of the plurality of wells is formed so as to continue to a corresponding well of an adjacent memory cell in the direction of the columns. As a result, each well extends long and narrowly in the direction of the columns in the memory array.

Data cell DC includes: an N channel MOS transistor N03 connected between a storage node A0 and bit line BL0 and having a gate connected to word line WL0; an N channel MOS transistor M04 connected between a storage node B0 and bit line /BL0 and having a gate connected to word line WL0; a P channel MOS transistor P01 connected between a power supply node VDD and storage node A0 and having a gate connected to storage node B0; and an N channel MOS transistor N01 connected between storage node A0 and a grounding node VSS and having a gate connected to storage node B0.

Data cell DC further includes: a P channel MOS transistor P02 connected between power supply node VDD and storage node B0 and having a gate connected to storage node A0; and an N channel MOS transistor N02 connected between storage node B0 and grounding node VSS and having a gate connected to storage node A0.

Mask data cell MDC includes: an N channel MOS transistor N13 connected between a storage node A1 and bit line BL0 having a gate connected to word line WL1; an N channel MOS transistor N14 connected between a storage node B1 and bit line /BL0 and having a gate connected to word line WL1; a P channel MOS transistor P11 connected between power supply node VDD and storage node A1 and having a gate connected to storage node B1; and an N channel MOS transistor N11 connected between storage node A1 and grounding node VSS and having a gate connected to storage node B1.

Mask data cell MDC further includes: a P channel MOS transistor P12 connected between power supply node VDD and storage node B1 and having a gate connected to storage node A1; and an N channel MOS transistor N12 connected between storage node B1 and grounding node VSS and having a gate connected to storage node A1.

Logical operation cell LC includes: N channel MOS transistors N06 and N05 connected in series between match line ML0 and the grounding node and having gates connected to search line SL0 and storage node B0, respectively; and N channel MOS transistors N16 and N15 connected in series between match line ML0 and the grounding node and having gates connected to search line /SL0 and storage node B1, respectively.

As described in the following with reference to a layout diagram, in memory cell MC0#0, a region LP and a region UP are arranged in linear symmetry across the axis in the direction of the rows.

Here, the other memory cells in FIG. 1 have the same internal circuit configuration as that of memory cell MC0#0 though they are different in that the corresponding word lines, match lines, bit lines and search lines are connected, and therefore, the descriptions thereof are not repeated.

Figures 3, 4:
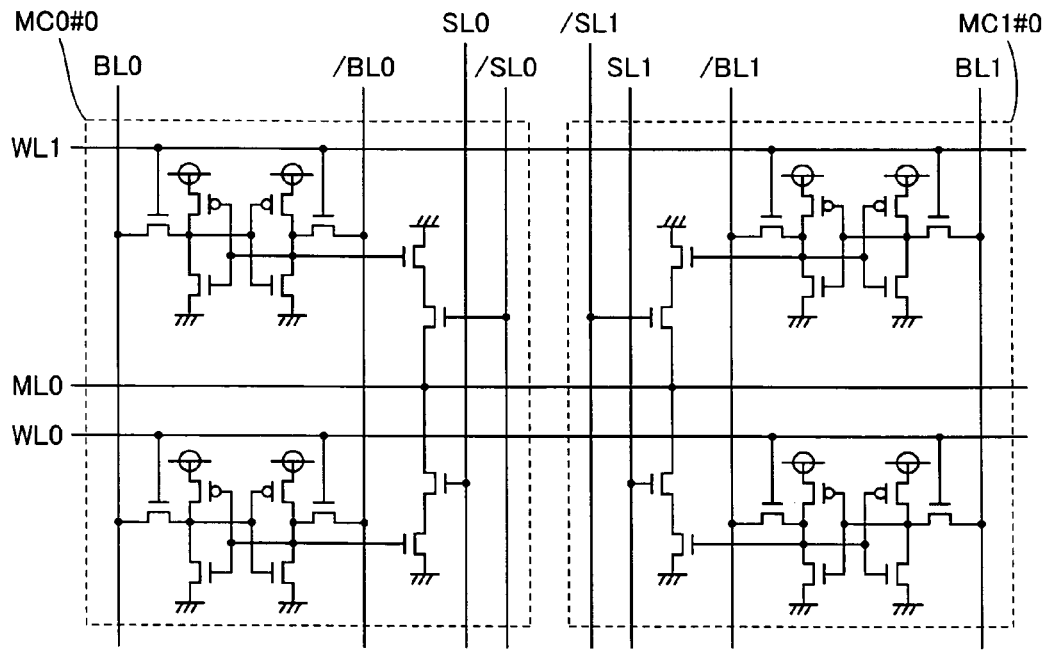
FIG. 3 is a diagram showing the arrangement of a portion of the memory array of FIG. 1.
FIG. 4 is a table for illustrating the operation of a memory cell according to the first embodiment.

FIG. 3 is a diagram showing the arrangement of a portion of the memory array of FIG. 1.

With reference to FIG. 3, memory cell MC0#0 and memory cell MC1#0 are placed adjacent each other in the direction of the rows. Corresponding search lines are respectively arranged for each TCAM cell column. That is to say, search line pairs SL0 and /SL0 are placed in memory cell MC0#0, and search line pairs SL1 and /SL1 are placed in memory cell MC1#0. In addition, one match line is wired for each cell row. That is to say, match line ML0 is arranged for the first memory cell row (memory cell MC0#0 and memory cell MC1#0) as shown in FIG. 3.

FIG. 4 is a table for illustrating the operation of a memory cell according to the first embodiment.

With reference to FIGS. 3 and 4, the operation at address #0 is briefly described.

First, word line WL0 is activated at the H (high) level and word line WL1 is deactivated at the L (low) level at the time of write of data into address #0. In addition, word lines WL2 to WL7, which correspond to addresses other than address #0 are deactivated at the L level. Thus, the level that corresponds to data bit D0 to be written is provided to bit line BL0, and the opposite level is provided to bit line /BL0. In addition, the level that corresponds to data bit D1 is provided to bit line BL1 and the opposite level is provided to bit line /BL1.

In addition, search line pairs SL0 and /SL0, as well as SL1 and /SL1, are all set at the L level. Though it is not necessary to set any particular level for match lines ML, they are preferably maintained at the pre-charged H level.

Word lines and the like are controlled in this manner, and thereby, data bit D0 is written into data cell DC of memory cell MC0#, and data bit D1 is written into data cell DC of memory cell MC1#. Here, at the time of readout, the difference in potential between bit lines is amplified by a sense amplifier, not shown, so that data bits D0 and D1 are read out.

First, word line WL1 is activated at the H level, and word line WL0 is deactivated at the L level at the time of write of the mask data into address #0. In addition, word lines WL2 to WL7 which correspond to addresses other than address #0 are deactivated at the L level. Then, the level which corresponds to mask data bit MD0 to be written is provided to bit line BL0 and the opposite level is provided to bit line /BL0. In addition, the level which corresponds to mask data bit MD1 is provided to bit line BL1, and the opposite level is provided to bit line /BL1.

In addition, search line pairs SL0 and /SL0, as well as SL1 and /SL1, are all set at the L level. Though it is not necessary to set any particular level for match lines ML, they are preferably maintained at the pre-charged H level.

The word lines and the like are controlled in this manner, and thereby, mask data bit MD0 is written into mask data cell MDC of memory cell MC0#0, and mask data bit MD1 is written into mask data cell MDC of memory cell MC1#0. Here, at the time of readout, the difference in potential between bit lines is amplified by a sense amplifier, not shown, so that mask data bits MD0 and MD1 are read out.

Next, the time of data search is described. At the time of data search, the data being searched for, which is provided by the search lines, and storage data in a plurality of addresses #0 to #3 are collectively compared, and whether or not the content held by the memory cell at each address matches with the data being searched for is outputted in one cycle. In this case, word lines WL0 to WL7 are all set at the L level, and bit lines BL0 and BL1 are preferably set at the H level. Search line SL0 is set at the level which corresponds to search data bit SD0 and search line /SL0 is set at the opposite level. In addition, search line SL1 is set at the level that corresponds to search data bit SD1 and search line /SL1 is set at the opposite level. As a result, in the case where any one of memory cells which correspond to address #0 does not match with the data being searched for, pre-charged match line ML0 changes to the L level as a result of wired OR logic. In the case where all the data bits match or the mask data is written, pre-charged match line ML0 is maintained in the pre-charged state, and as a result, output OUT becomes the H level.

FIGS. 5 to 8 are schematic plan diagrams showing the layout of the memory array according to the first embodiment divided in the direction of layering.

Figure 5:
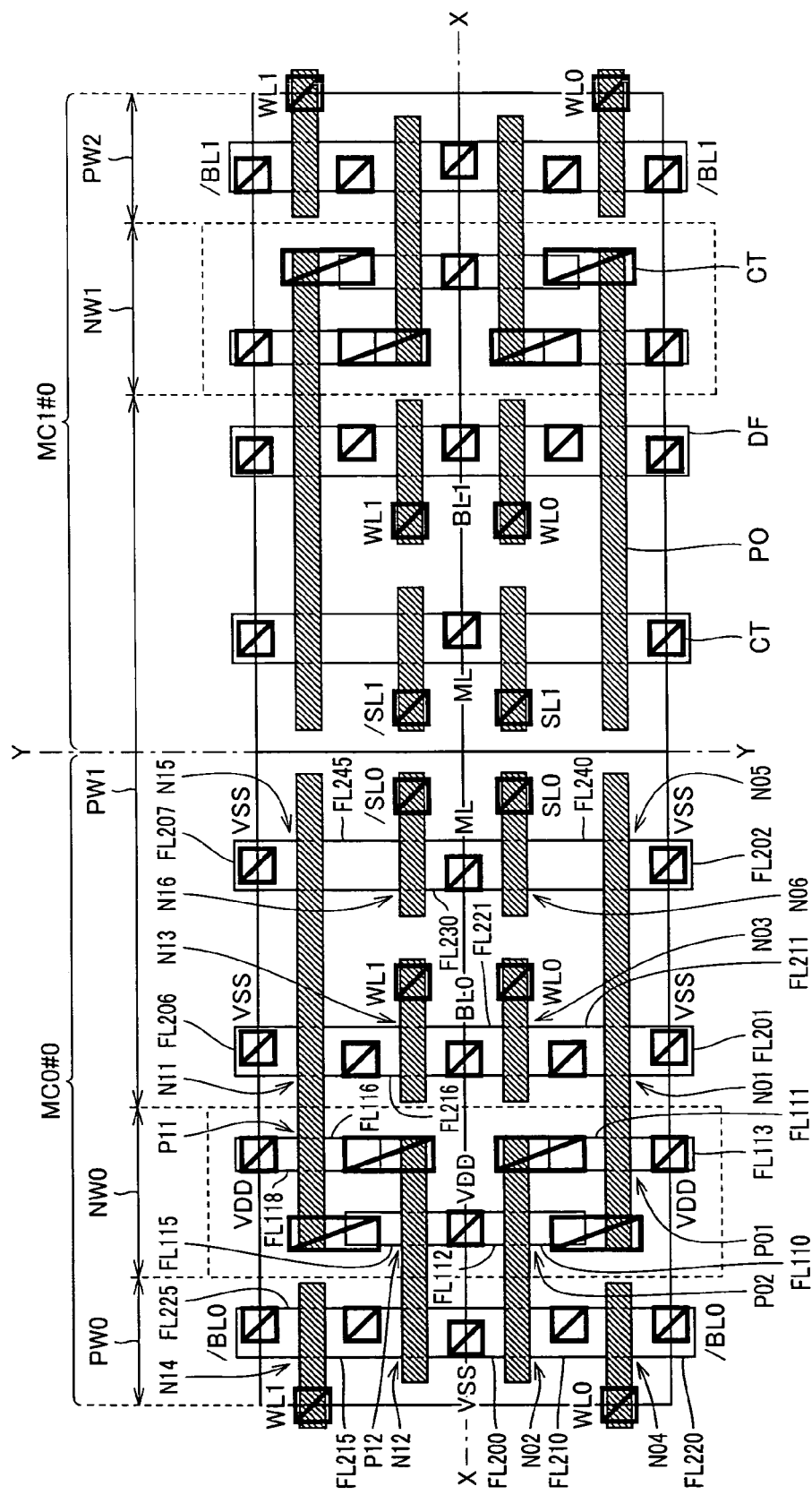
FIG. 5 is a diagram showing the arrangement of a well, a diffusion region DF, polysilicon PO and a contact hole CT in the memory array according to the first embodiment.

FIG. 5 is a plan diagram showing the arrangement of a well, a diffusion region DF, polysilicon PO and a contact hole CT in the memory array according to the first embodiment.

FIG. 5 shows TCAM cells for two bits, that is to say, memory cell MC0#0 and memory cell MC1#0 which is adjacent to memory cell MC0#0 in the direction of X. Here, in FIG. 5, symbols are attached only to one representative contact hole CT, polycrystal silicon (polysilicon) PO and diffusion region DF.

Each of memory cell MC0#0 and memory cell MC1#0 is divided into a data bit and a mask bit along axis X-X. The data bit and the mask bit can be formed so as to have the same layout as conventional single port SRAM's formed of six transistors.

In memory cell MC0#0, there is an N well NW0 in the center portion in the direction of X, and a P channel MOS transistor is formed inside. P wells PW0 and PW1 are placed on both sides of this N well NW0, and N channel MOS transistors are formed inside P wells PW0 and PW1. In addition, a search transistor providing a search function is formed of an N channel MOS transistor within P well PW1. Here, the wells continue in a line with the wells of other memory cells in the same column, and therefore, the direction in which the wells extend is the same as the direction in which the bit lines and the search lines extend, and is the direction perpendicular to the word lines and match lines.

This is described in further detail below. One N well NW0 and two P wells PW0 and PW1 which sandwich this N well NW0 are formed on the surface of the semiconductor substrate for memory cell MC0#0. In addition, memory cell MC1#0 is placed in line symmetry with memory cell MC0#0 across the Y axis, and formed of P well PW1 which is shared by these memory cells, as well as N well NW1 which corresponds to N well NW0 and P well PW2 which corresponds to P well PW0.

In the region corresponding to region LP in FIG. 2, P channel MOS transistors P01 and P02 are formed within N well NW0. In addition, N channel MOS transistors N02 and N04 are formed within P well PW0, and N channel MOS transistors N01, N03, N05 and N06 are placed within P well PW1.

N channel MOS transistor N01 has a source and a drain made of a pair of N type diffusion regions FL201 and FL211, as well as a polysilicon gate which is placed between the source and the drain. N type diffusion region FL201 is electrically coupled to grounding node VSS via contact hole CT.

N channel MOS transistor N03 has a source and a drain made of a pair of N type diffusion regions FL221 and FL211, as well as a gate made of polysilicon which is placed between the source and the drain. This gate is electrically connected to word line WL0 via contact hole CT. In addition, N type diffusion region FL221 is electrically coupled to bit line BL0 via contact hole CT.

N channel MOS transistor N04 has a source and a drain made of a pair of N type diffusion regions FL220 and FL210, as well as a gate made of polysilicon which is placed between the source and the drain. This gate is electrically connected to word line WL0 via contact hole CT. In addition, N type diffusion region FL220 is electrically coupled to bit line /BL0 via contact hole CT.

N channel MOS transistor N02 has a source and a drain made of a pair of N type diffusion regions FL200 and FL210, as well as a gate made of polysilicon which is placed between the source and the drain. N type diffusion region FL200 is electrically coupled to grounding node VSS via contact hole CT.

P channel MOS transistor P01 has a source and a drain made of P type diffusion regions FL113 and FL111, as well as a gate formed of polysilicon which is placed between the source and the drain. This gate is formed of polysilicon and continues in a line with the gate of N channel MOS transistor N01. P type diffusion region FL113 is electrically connected to power supply node VDD via contact hole CT.

P channel MOS transistor P02 has a source and a drain made of P type diffusion regions FL110 and FL112, as well as a gate formed of polysilicon which is placed between the source and the drain. This gate is formed of polysilicon and continues in a line with the gate of N channel MOS transistor N02, and is electrically connected to p type diffusion region FL111 via contact hole CT. In addition, P type diffusion region FL112 is electrically connected to power supply node VDD via contact hole CT. In addition, P type diffusion region FL110 is electrically connected to the polysilicon gate of P channel MOS transistor P01 via contact hole CT.

N channel MOS transistor N05 has a source and a drain made of a pair of N type diffusion regions FL240 and FL202, as well as a gate formed of polysilicon which is placed between the source and the drain. This gate is formed of polysilicon which is shared by the gates of P channel MOS transistor P01 and N channel MOS transistor N01. N type diffusion region FL202 is electrically coupled to grounding node VSS via contact hole CT.

N channel MOS transistor N06 has a source and a drain made of N type diffusion regions FL230 and FL240, as well as a gate of polysilicon which is placed between the source and the drain. This gate is electrically connected to search line SL0 via contact hole CT. In addition, N type diffusion region FL230 is electrically connected to match line ML via contact hole CT.

In addition, in the region corresponding to region UP of FIG. 2, P channel MOS transistors P11 and P12 are formed within N well NW0. In addition, N channel MOS transistors N12 and N14 are formed within P well PW0, and N channel MOS transistors N11, N13, N15 and N16 are placed within P well PW1.

N channel MOS transistor N11 has a source and a drain made of a pair of N type diffusion regions FL206 and FL216, as well as a polysilicon gate placed between the source and the drain. N type diffusion region FL206 is electrically coupled to grounding node VSS via contact hole CT.

N channel MOS transistor N13 has a source and a drain made of a pair of N type diffusion regions FL221 and FL216, as well as a gate formed of polysilicon which is placed between the source and the drain. This gate is electrically coupled to word line WL1 via contact hole CT. In addition, N type diffusion region FL221 is electrically coupled to bit line BL0 via contact hole CT as described above.

N channel MOS transistor N14 has a source and a drain made of a pair of N type diffusion regions FL225 and FL215, as well as a gate formed of polysilicon which is placed between the source and the drain. This gate is electrically coupled to word line WL1 via contact hole CT. In addition, N type diffusion region FL225 is electrically coupled to bit line /BL0 via contact hole CT.

N channel MOS transistor N12 has a source and a drain made of a pair of N type diffusion regions FL200 and FL215, as well as a gate formed of polysilicon which is placed between the source and the drain. N type diffusion region FL200 is electrically coupled to grounding node VSS via contact hole CT as described above.

P channel MOS transistor P11 has a source and a drain made of P type diffusion regions FL118 and FL116, as well as a gate formed of polysilicon which is placed between the source and the drain. This gate is formed of polysilicon and continues in a line with the gate of N channel MOS transistor N11. P type diffusion region FL118 is electrically connected to power supply node VDD via contact hole CT.

P channel MOS transistor P12 has a source and a drain made of a pair of P type diffusion regions FL115 and FL112, as well as a gate formed of polysilicon which is placed between the source and the drain. This gate is formed of polysilicon and continues in a line with the gate of N channel MOS transistor N12, and is electrically connected to P type diffusion region FL116 via contact hole CT. In addition, P type diffusion region FL112 is electrically connected to power supply node VDD via contact hole CT as described above. In addition, P type diffusion region FL115 is electrically connected to the polysilicon gate of P channel MOS transistor P11 via contact hole CT.

N channel MOS transistor N15 has a source and a drain made of a pair of N type diffusion regions FL245 and FL207, as well as a gate formed of polysilicon which is placed between the source and the drain. This gate is formed of polysilicon which is shared by the gates of P channel MOS transistor P11 and N channel MOS transistor N11. N type diffusion region FL207 is electrically coupled to grounding node VSS via contact hole CT.

N channel MOS transistor N16 has a source and a drain made of N type diffusion regions FL230 and FL245, as well as a gate formed of polysilicon which is placed between the source and the drain. This gate is electrically connected to search line /SL0 via contact hole CT. In addition, N type diffusion region FL230 is electrically connected to match line ML via contact hole CT as described above.

The respective N type diffusion regions are formed by implanting N type impurities into active regions of P wells PW0, PW1 and PW2. In addition, the respective P type diffusion regions are formed by implanting P type impurities into active regions of N wells NW0 and NW1.

Here, though memory cell MC1#0 is different from memory cell MC0#0 in that corresponding search lines and bit lines are connected to memory cell MC1#0, the arrangement of the transistors and the diffusion regions in memory cell MC1#0 is in line symmetry with the arrangement in memory cell MC0#0 across the Y axis, and therefore, the same descriptions are not repeated.

Figure 6:
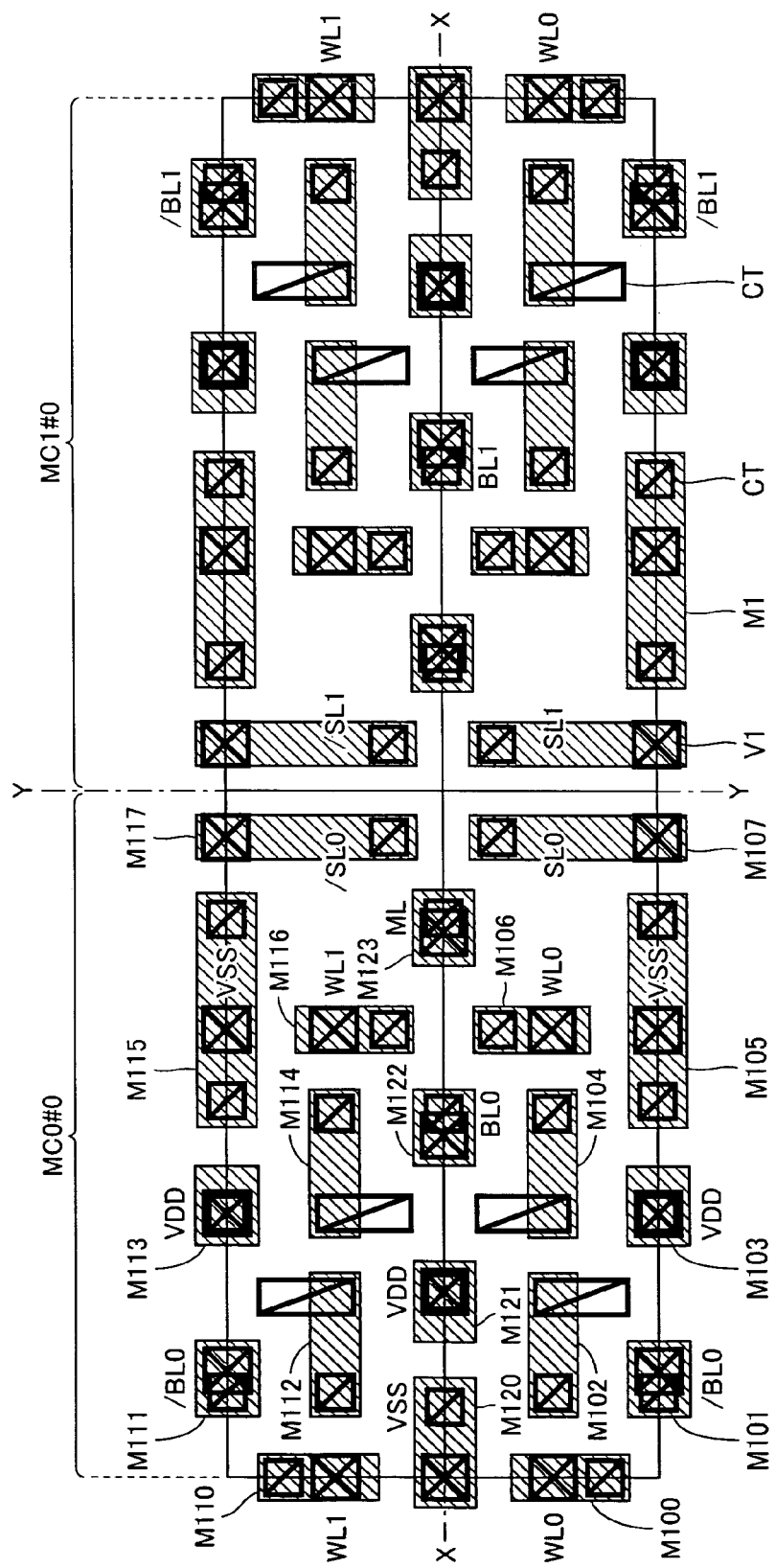
FIG. 6 is a diagram showing the arrangement of a contact hole CT, a first metal interconnection layer M1 and a first via hole V1 in the memory array according to the first embodiment.
Figure 7:
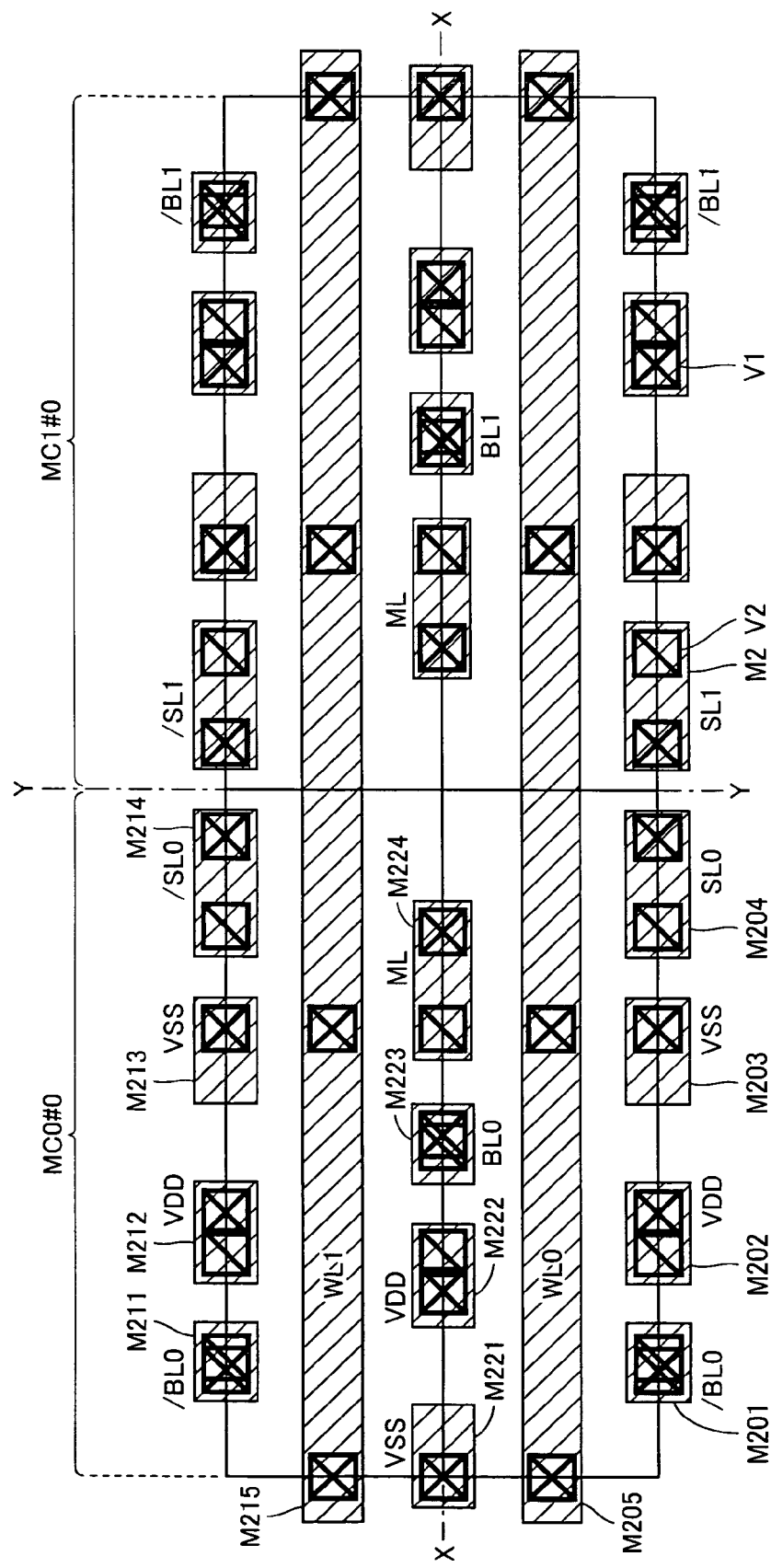
FIG. 7 is a diagram showing the arrangement of a first via hole V1, a second metal interconnection layer M2 and a second via hole V2 in the memory array according to the first embodiment.
Figure 8:
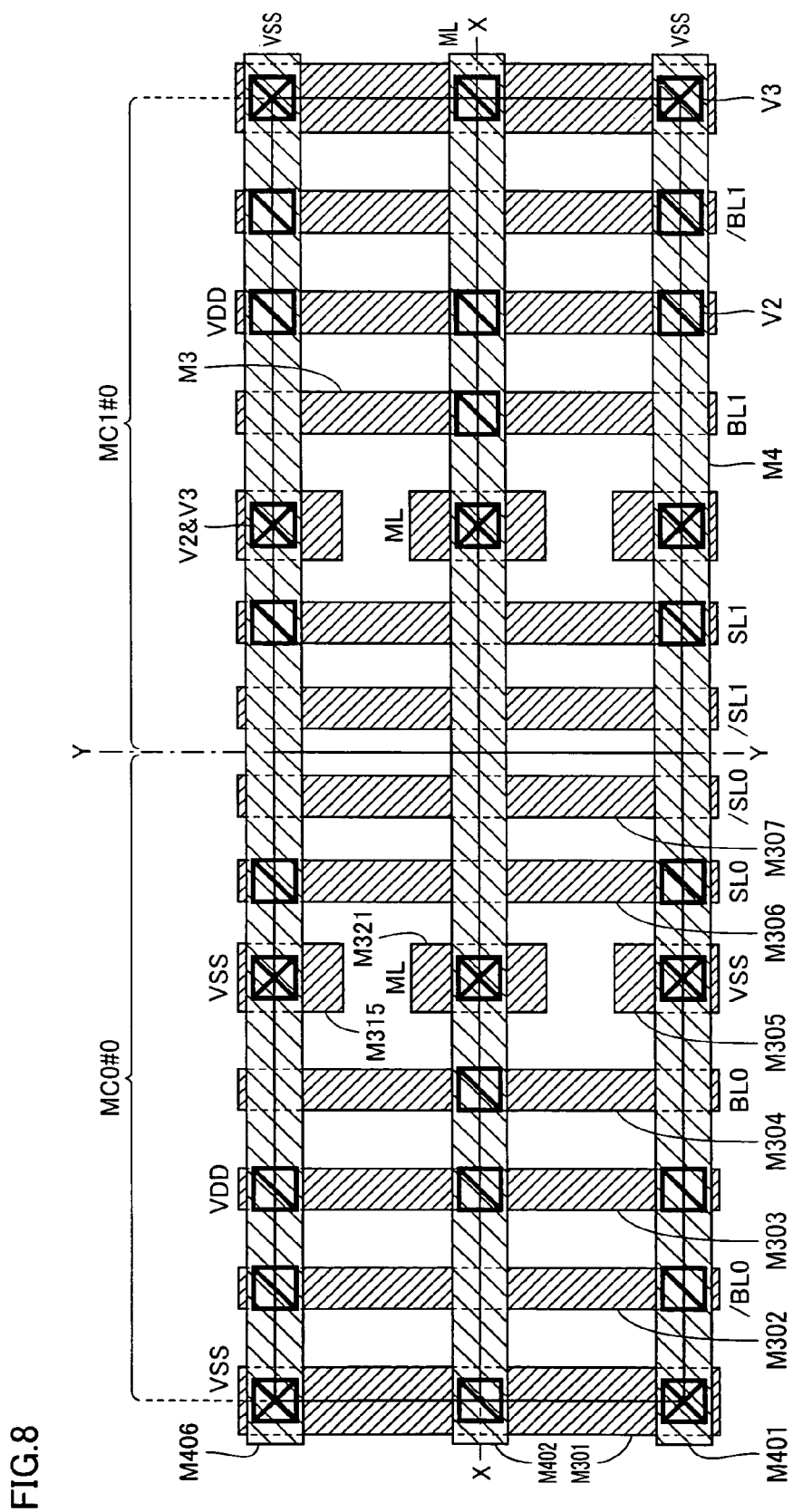
FIG. 8 is a diagram showing the arrangement of a second via hole, a third metal interconnection layer, a third via hole and a fourth metal interconnection layer.

FIGS. 6, 7 and 8 are diagrams showing the patterns of a metal interconnection, a contact hole and a via hole in the memory array according to the first embodiment.

FIG. 6 is a plan diagram showing the arrangement of a contact hole CT, a first metal interconnection layer M1 and a first via hole V1 in the memory array according to the first embodiment.

FIG. 7 is a plan diagram showing the arrangement of a first via hole V1, a second metal interconnection layer M2 and a second via hole V2 in the memory array according to the first embodiment.

FIG. 8 is a plan diagram showing the arrangement of a second via hole, a third metal interconnection layer, a third via hole and a fourth metal interconnection layer.

In FIG. 6, symbols are attached to only several representative portions for a contact hole CT, a first metal interconnection layer M1 and a first via hole V1.

Word line WL0 is wired in the second metal interconnection layer in the direction along the X axis. Bit line pairs are wired in the third metal interconnection layer in the direction along the Y axis. In addition, search line pairs SL0 and /SL0, as well as SL1 and /SL1, are wired in the third metal interconnection layer in the direction along the Y axis.

One power supply line VDD is wired in the third metal interconnection layer per column unit. Grounding lines VSS are wired in the third metal interconnection layer in the border portion between cells in the direction along the Y axis. In addition, match lines ML are wired in the fourth metal interconnection layer, which is the top layer, in the direction along the X axis.

In each column, bit line pairs are connected so as to be shared by the data bits and the mask bits. In addition, match line ML is connected so as to be shared by cells adjacent in the direction of the X axis, that is to say, memory cells MC0#0 and MC1#0, and extends the direction along the X axis.

This is described in further detail below. With reference to FIGS. 5 and 6, firstly, a first metal interconnection M100 is electrically connected to the gate of N channel MOS transistor N04 via contact hole CT. In addition, this first metal interconnection M100 is connected to a second metal interconnection M205 in FIG. 7 through via hole V1. This second metal interconnection M205 is word line WL0 which crosses the memory cells along the direction of the X axis.

A first metal interconnection M101 is electrically connected to N type diffusion region FL220 via contact hole CT, and electrically connected to a second metal interconnection M201 of FIG. 7 through via hole V1, and furthermore, electrically connected to a third metal interconnection M302 of FIG. 8 through via hole V2. This third metal interconnection M302 is bit line /BL0 which crosses memory cell MC0#0 along the direction of the Y axis. A first metal interconnection M102 of FIG. 6 electrically connects N type diffusion region FL210 and P type diffusion region FL110 via contact hole CT.

A first metal interconnection M104 electrically connects P type diffusion region FL110 and N type diffusion region FL211 via contact hole CT. A first metal interconnection M103 is connected to P type diffusion region FL113 via contact hole CT. In addition, first metal interconnection M103 is connected to a second metal interconnection M202 of FIG. 7 through via hole V1, and second metal interconnection M202 is connected to a third metal interconnection M303 of FIG. 8 through via hole V2.

A first metal interconnection M105 of FIG. 6 electrically connects N type diffusion regions FL201 and FL202 of FIG. 5 via contact hole CT, and is electrically connected to a second metal interconnection M203 of FIG. 7 through via hole V1, and this second metal interconnection M203 is connected to a third metal interconnection M305 of FIG. 8 through via hole V2. Third metal interconnection M305 is connected to a fourth metal interconnection M401 through via hole V3. Fourth metal interconnection M401 is grounding line VSS which is wired along the border between memory cell MC0#0 and MC1#0 in the direction along the X axis.

A first metal interconnection M106 of FIG. 6 is electrically connected to the gate of transistor N03 of FIG. 5 via contact hole CT, and electrically connected to a second metal interconnection M205 which is word line WL0 of FIG. 7 through via hole V1.

A first metal interconnection M107 of FIG. 6 is electrically connected to the gate of N channel MOS transistor N06 of FIG. 5 via contact hole CT, and connected to a second metal interconnection M204 of FIG. 7 through via hole V1. Second metal interconnection M204 is electrically connected to a third metal interconnection M306 of FIG. 8 through via hole V2. This third metal interconnection M306 is a search line SL0 which crosses memory cell MC0#0 in the direction along the Y axis.

A first metal interconnection M120 of FIG. 6 is electrically connected to N type diffusion region FL200 via contact hole CT, and connected to a second metal interconnection M221 of FIG. 7 through via hole V1. Second metal interconnection M221 is connected to a third metal interconnection M301 of FIG. 8 through via hole V2.

A first metal interconnection M121 of FIG. 6 is electrically connected to P type diffusion region FL112 via contact hole CT, and connected to a second metal interconnection M222 of FIG. 7 through via hole V1. Second metal interconnection M222 is connected to a third metal interconnection M307 which is power supply line VDD of FIG. 8 through via hole V2.

A first metal interconnection M122 of FIG. 6 is electrically connected to N type diffusion region FL221 via contact hole CT, and electrically connected to a second metal interconnection M223 of FIG. 7 through via hole V1. Second metal interconnection M223 is electrically connected to a third metal interconnection M304 of FIG. 8 thorough via hole V2. This third metal interconnection M304 is bit line BL0 which crosses memory cell MC0#0 in the direction along the Y axis.

A first metal interconnection M123 of FIG. 6 is electrically connected to N type diffusion region FL230 of FIG. 5 via contact hole CT, and electrically connected to a second metal interconnection M224 of FIG. 7 through via hole V1. Second metal interconnection M224 is electrically connected to a third metal interconnection M321 of FIG. 8 through via hole V2, and third metal interconnection M321 is electrically connected to a fourth metal interconnection M402 through via hole V3.

This fourth metal interconnection M402 is match line ML which crosses memory cell MC0#0 and memory cell MC1#0 in the direction along the X axis.

A first metal interconnection M110 of FIG. 6 is electrically connected to the gate of N channel MOS transistor N14 via contact hole CT. In addition, this first metal interconnection M110 is connected to a second metal interconnection M215 of FIG. 7 through via hole V1. This second metal interconnection M215 is word line WL1 which crosses memory cells in the direction along the X axis.

A first metal interconnection M111 of FIG. 6 is electrically connected to N type diffusion region FL225 via contact hole CT, and electrically connected to a second metal interconnection M211 of FIG. 7 through via hole V1, and in addition, electrically connected to a third metal interconnection M302 of FIG. 8 through via hole V2. This third metal interconnection M302 is bit line /BL0 which crosses memory cell MC0#0 along the direction of the Y axis as described above.

A first metal interconnection M112 of FIG. 6 electrically connects N type diffusion region FL215 and P type diffusion region FL115 via contact hole CT.

A first metal interconnection M114 of FIG. 6 electrically connects P type diffusion region FL115 and N type diffusion region FL216 via contact hole CT. A first metal interconnection M113 is connected to P type diffusion region FL118 via contact hole CT. In addition, first metal interconnection M113 is connected to a second metal interconnection M212 of FIG. 7 through via hole V1, and second metal interconnection M212 is connected to a third metal interconnection M303 of FIG. 8 through via hole V2. This third metal interconnection M303 is power supply line VDD which crosses memory cell MC0#0 along the direction of the Y axis.

A first metal interconnection M115 of FIG. 6 electrically connects N type diffusion regions FL206 and FL207 of FIG. 5 via contact hole CT, and is electrically connected to a second metal interconnection M213 of FIG. 7 through via hole V1, and this second metal interconnection M213 is connected to a third metal interconnection M315 of FIG. 8 through via hole V2. Third metal interconnection M315 is connected to a fourth metal interconnection M401 through via hole V3. Fourth metal interconnection M401 is grounding line VSS which is wired along the border between memory cells MC0#0 and MC1#0 in the direction along the X axis.

A first metal interconnection M116 of FIG. 6 is electrically connected to the gate of transistor N13 of FIG. 5 via contact hole CT, and electrically connected to a second metal interconnection M215 which is word line WL1 of FIG. 7 through via hole V1.

A first metal interconnection M117 of FIG. 6 is electrically connected to the gate of N channel MOS transistor N16 of FIG. 5 via contact hole CT, and connected to a second metal interconnection M214 of FIG. 7 through via hole V1. Second metal interconnection M214 is electrically connected to a third metal interconnection M307 of FIG. 8 through via hole V2. This third metal interconnection M307 is search line /SL0 which crosses memory cell MC0#0 in the direction along the Y axis.

Here, though the arrangement of the metal interconnection layers inside memory cell MC0#0 is different from that of memory cell MC0# in that corresponding search lines and bit lines are connected to memory cell MC0#0, the arrangement of the wiring pattern in memory cell MC0#0 is in line symmetry with that in memory cell MC0#0 across the Y axis, and therefore, the descriptions are not repeated.

As shown in FIG. 8, grounding lines VSS extend in the lateral direction as fourth metal interconnections M401 and M406, and grounding lines VSS extend in the longitudinal direction as third metal interconnection M301 and a third metal interconnection that is placed in symmetry with this third metal interconnection M301 across the Y axis. These grounding lines are placed in a repeating pattern, and as a result, grounding line VSS are wired in mesh form within the memory array, and thus, provide effects of preventing localized drops in voltage. In addition, in the fourth metal interconnection layer, match lines are wired at wide intervals according to the first embodiment, and thus, the coupling capacitance can be reduced. As a result, the power consumption for charging and discharging the match lines can be kept low, and increase in the speed of the search operation can be achieved.

Power supply lines VDD which are the third metal interconnections are independent in each column, and therefore, it is possible to control the VDD potential for each column, and thus, widening of the operation margin, reduction in the power required for charging and discharging the bit lines, and the like can be achieved.

In addition, the layout is formed as described above, and thereby, a highly integrated TCAM memory array can be realized, with layers up to a fourth metal layer. Since the number of interconnection layers can be reduced, the manufacturing cost can be reduced.

The respective gates shown in FIG. 5 can be oriented in the direction along the X axis, and therefore, inconsistencies in processing caused by uneven etching or the like, and inconsistencies in change in the size of the formed transistors caused by shifting of the mask can be reduced.

Furthermore, the bit lines and the search lines can be shortened, and therefore, the wire capacitance can be reduced and the power consumption for charging and discharging of the search line and the bit lines reduced. In addition, there is an advantage, such that increase in the speed can be achieved, by reducing the wire capacitance.

Second Embodiment

Figure 9:
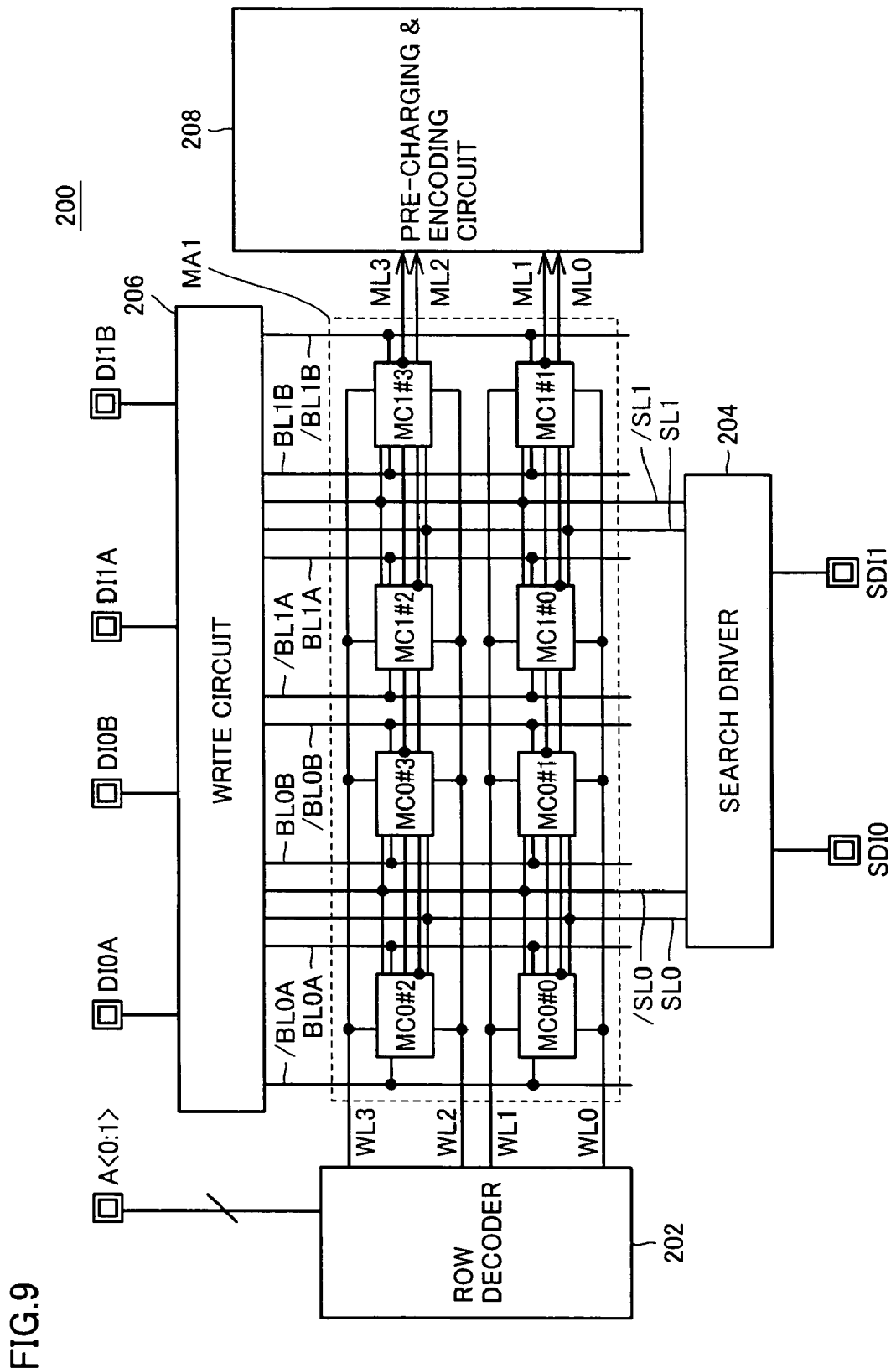
FIG. 9 is a block diagram schematically showing the configuration of a semiconductor memory device according to a second embodiment.

FIG. 9 is a block diagram schematically showing a semiconductor memory device according to the second embodiment.

With reference to FIG. 9, a semiconductor memory device 200 includes: a row decoder 202 for selectively activating word lines WL0 to WL3 in response to an address signal A<0:1>; and a search driver 204 for driving search line pairs SL0 and /SL0 as well as SL1 and /SL1 in response to search data SDI0 and SDI1.

Semiconductor memory device 200 further includes: a write circuit 206 for driving bit line pairs BL0A and /BL0A, BL0B and /BL0B, BL1A and /BL1A as well as BL1B and /BL1B in response to input data DI0A, DI1A, DI0B and DI1B; a memory array MA1, which are connected to word lines WL0 to WL3, search line pairs SL0 and /SL0, SL1 and /SL1 and bit line pairs BL0A and /BL0A, BL0B and /BL0B, BL1A and /BL1A, BL1B and /BL1B; and a pre-charging & encoding circuit 208 for pre-charging match lines ML0 to ML3, which extend from memory array MA1 and for encoding the corresponding results which are outputted to these match lines.

Memory array MA1 is a modification of that of the first embodiment where the array configuration is slightly changed in the arrangement. TCAM cells are physically arranged in two rows and four columns. Accordingly, as for the width and length dimensions, the width is two times as wide and the length is ½ as long as compared with the dimensions in the case of the first embodiment shown in FIG. 1. Addresses in the first row on the lower side are allocated to addresses #0 and #1 and addresses in the second row on the upper side are allocated to addresses #2 and #3. The present embodiment is different from the first embodiment in that memory cells which are adjacent in the direction of the rows in each row have different addresses.

Meanwhile, two match lines are wired to TCAM cells of which four cells are physically aligned in one row. Concretely speaking, match lines ML0 and ML1 are placed for the memory cells in the first row. From among these, match line ML0 is connected to memory cells MC0#0 and MC1#0 which correspond to address #0. In addition, match line ML1 is connected to memory cells MC0#L and MC1#1 which correspond to address #1.

In addition, match lines ML2 and ML3 are placed for the memory cells in the second row. From among these, match line ML2 is connected to memory cells MC0#2 and MC1#2 which correspond to address #2. In addition, match line ML3 is connected to memory cells MC0#3 and MC1#3 which correspond to address #3.

As described above, the present embodiment has a configuration where match lines are connected to alternate two cell units in each row. In this manner, though the physical arrangement is different from that in the case of the first embodiment, this memory array operates in exactly the same manner in terms of the search function.

That is to say, two search line pairs SL0 and /SL0 as well as SL1 and /SL1, and four match lines ML0 to ML3 are wired and operate in the same manner in terms of the search function as that of the first embodiment.

Meanwhile, the first and second embodiments have slightly different operations in terms of readout and write. In the first embodiment, memory cells MC0#0 and MC0#1 are connected to different word lines, and therefore can not be read out or written at the same time. Meanwhile, in the second embodiment, the same word line is wired for two cells, memory cells MC0#0 and MC0#1, and different bit line pairs are wired for the two cells, and therefore, the data of these two cells can be read out or written at the same time.

As a result, data can be simultaneously written into or read out from two addresses in one cycle, and therefore, the effects can be gained where the number of cycles in which data is written can be reduced. In addition, the length of the search lines becomes half of that in the case of the first embodiment, and therefore, the capacitance of interconnections can be reduced. As a result, an increase in the speed of operation and a reduction in the consumed power can be achieved.

Figure 10:
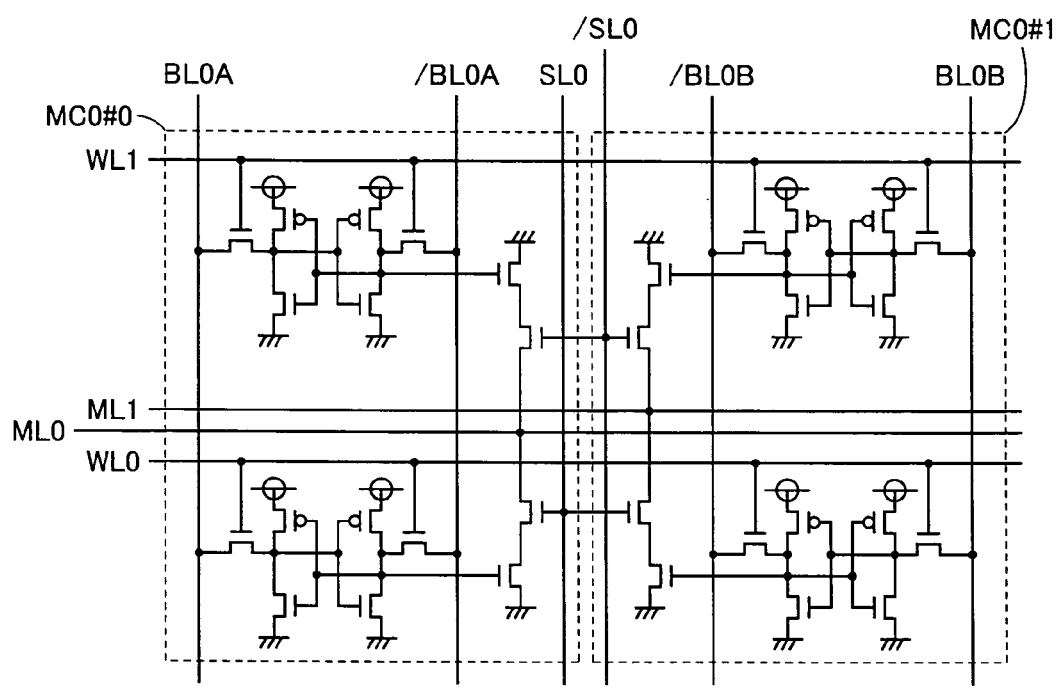
FIG. 10 is a circuit diagram showing the relationship between memory cells MC0#0 and MC0#1 which are adjacent to each other in memory array MA1.

FIG. 10 is a circuit diagram showing the relationship between memory cells MC0#0 and MC0#1 which are adjacent to each other in memory array MA1.

FIG. 11 is a table for illustrating the operation of a memory cell according to the second embodiment.

With reference to FIGS. 10 and 11, the operation of a memory cell is described in further detail.

First, in the case where data is written into addresses #0 and #1 simultaneously, word line WL0 is activated at the H level and word line WL1 is deactivated at the L level. Word lines WL2 and WL3 are for addresses different from those for word line WL1 and thus deactivated at the L level.

Then, bit line BL0A is set at the level which corresponds to data D0#0 in the $0^{th}$ bit that is written into address #0, and bit line /BL0A is set at the opposite level. Bit line BL0B is set at the level which corresponds to data D0#1 in the $0^{th}$ bit that is written into address #1, and bit line /BL0B is set at the opposite level.

In addition, bit line BL1A is set at the level which corresponds to data D1#0 in the $1^{st}$ bit that is written into address #0, and bit line /BL1A is set at the opposite level. Bit line BL1B is set at the level which corresponds to data D1#1 in the $1^{st}$ bit that is written into address #1, and bit line /BL1B is set at the opposite level.

At the time of data write, search line pairs SL0 and /SL0, as well as SL1 and /SL1 are all deactivated at the L level. Then, match line ML is maintained in a pre-charged state at a certain level, preferably at the H level.

Next, a case where mask data is simultaneously written into addresses #0 and #1 is described. At this time, word line WL0 is deactivated at the L level and word line WL1 is activated at the H level. Word lines WL2 and WL3 are not for the addresses which are the objects of write, and thus, are deactivated at the L level.

At this time, bit line BL0A is set at the level that corresponds to data MD0#0 which is mask data in the $0^{th}$ bit that is written into address #0, and bit line /BL0A is set at the opposite level. Bit line BL0B is set at the level that corresponds to data MD0#1 which is mask data in the $0^{th}$ bit that is written into address #1, and bit line /BL0B is set at the opposite level.

In addition, bit line BL1A is set at the level that corresponds to data MD1#0 which is mask data in the $1^{st}$ bit that is written into address #0, and bit line /BL1A is set at the opposite level. Bit line BL1B is set at the level that corresponds to data MD1#1 which is mask data in the $1^{st}$ bit that is written into address #1, and bit line /BL1B is set at the opposite level.

At this time, search line SL0, /SL0, SL1 and /SL1 are deactivated at the L level, and match line ML is pre-charged at a certain level, preferably at the H level.

In contrast, when searching data, data is compared with that of all the memory cells in memory array MA1. At this time, word lines WL0 to WL3 are all deactivated at the L level, and bit lines BL0A, BL0B, BL1A, BL1B, /BL0A, /BL0B, /BL1A and /BL1B are all in a pre-charged state at a certain level, preferably at the H level.

At this time, search line SL0 is set at the level which corresponds to data SD0 in the $0^{th}$ bit of the search data, and search line /SL0 is set at the opposite level. In addition, search line SL1 is set at the level which corresponds to data SD1 in the $1^{st}$ bit of the search data, and search line /SL1 is set at the opposite level.

Then, match line ML becomes the H level in the case where the search data matches entirely with the data in the corresponding address, and charge of the match line that has been pre-charged is drawn out and the match line outputs the L level as output signal OUT in the case where the search data does not match with the data in any bit in the corresponding address. In addition, in the case where mask data is written into the corresponding address, the match line becomes the H level in the same manner as in the matching case.

FIGS. 12 to 15 are schematic plan diagrams showing the layout of the TCAM cells according to the second embodiment divided in the direction of layering. For the purpose of clarification, the entire layers are divided into the portion where transistors are formed and a plurality of interconnection layers in the same manner as in the case of the first embodiment.

Figure 12:
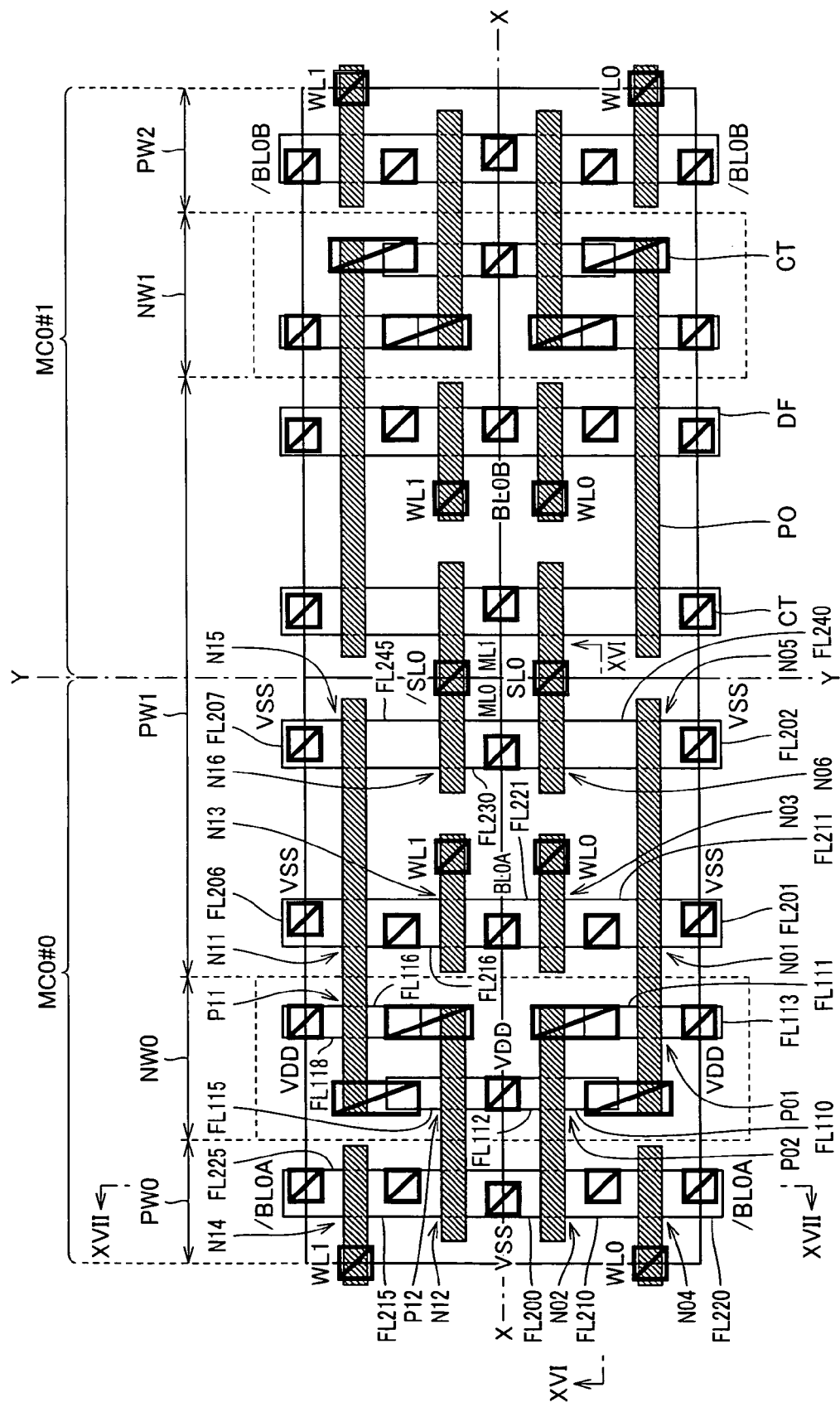
FIG. 12 is a diagram showing the arrangement of a well, a diffusion region DF, polysilicon PO and a contact hole CT in the memory array according to the second embodiment.

FIG. 12 is a plan diagram showing the arrangement of a well, a diffusion region DF, polysilicon PO and a contact hole CT in the memory array according to the second embodiment.

The layout of FIG. 12 according to the second embodiment is different from the layout of FIG. 5 according to the first embodiment in that the gates of N channel MOS transistors N06 and N16 which are search transistors of memory cell MC0#0 and the gates of the corresponding transistors in adjacent memory cell MC0#1 in FIG. 12 are formed of the same polysilicon interconnection.

In such an arrangement, the width in the direction along the X axis can be made shorter than that of the first embodiment, and therefore, an increase in the integration can be achieved.

In addition, in the first embodiment of FIG. 5, four small islands of polysilicon interconnections which form the gates of transistors N03 and N06 as well as the two corresponding transistors in adjacent memory cell MC1#0 are continuously arranged in the direction along the X axis in the pattern.

In contrast, in the second embodiment, there is only one small polysilicon interconnection portion, which is the gate of N channel MOS transistor N03. Small islands of gates fall down and scatter at the time of processing such as an etching process, and easily become a cause of defects and easily cause a reduction in the yield. An increase in the manufacturing yield can be expected by reducing the number of such small islands of gates.

Figure 15:
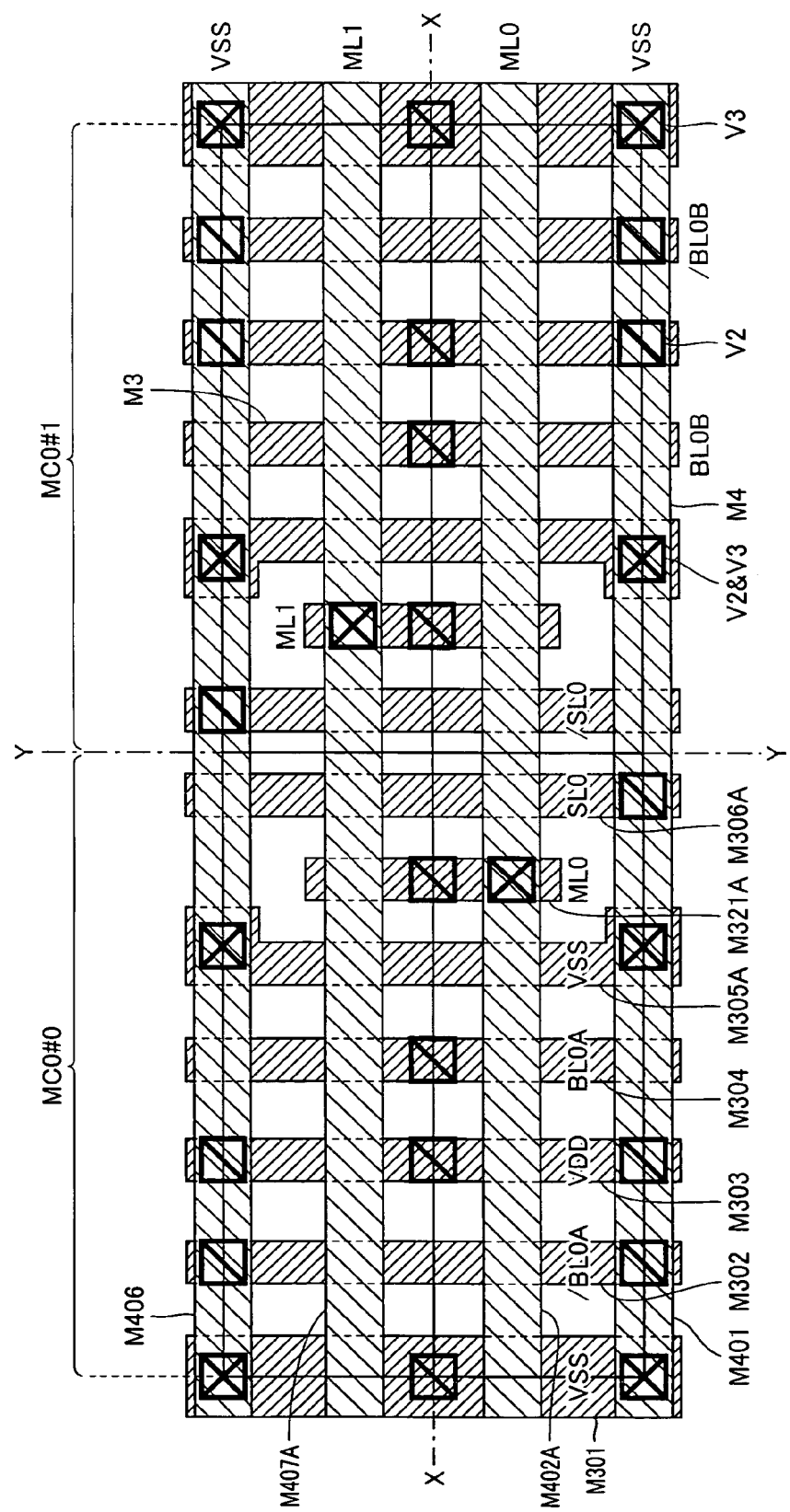
FIG. 15 is a diagram showing the arrangement of a via hole V2, a third metal interconnection layer M3, a via hole V4 and a fourth metal interconnection M4 in the memory array according to the second embodiment.

In addition, bit line pair BL0A and /BL0A are shielded from each other by power supply interconnection VDD, and are shielded from bit lines of adjacent memory cells by grounding lines VSS, as shown in FIG. 15, in the same manner as the first embodiment, and therefore, the coupling capacitance between the bit line pair which runs in parallel can be prevented from causing a malfunction. In addition, match lines ML0 and ML1 can also be formed in the fourth metal interconnection layer, and thereby, the interval between them can be made great, and thus, the coupling capacitance can be reduced.

Figure 13:
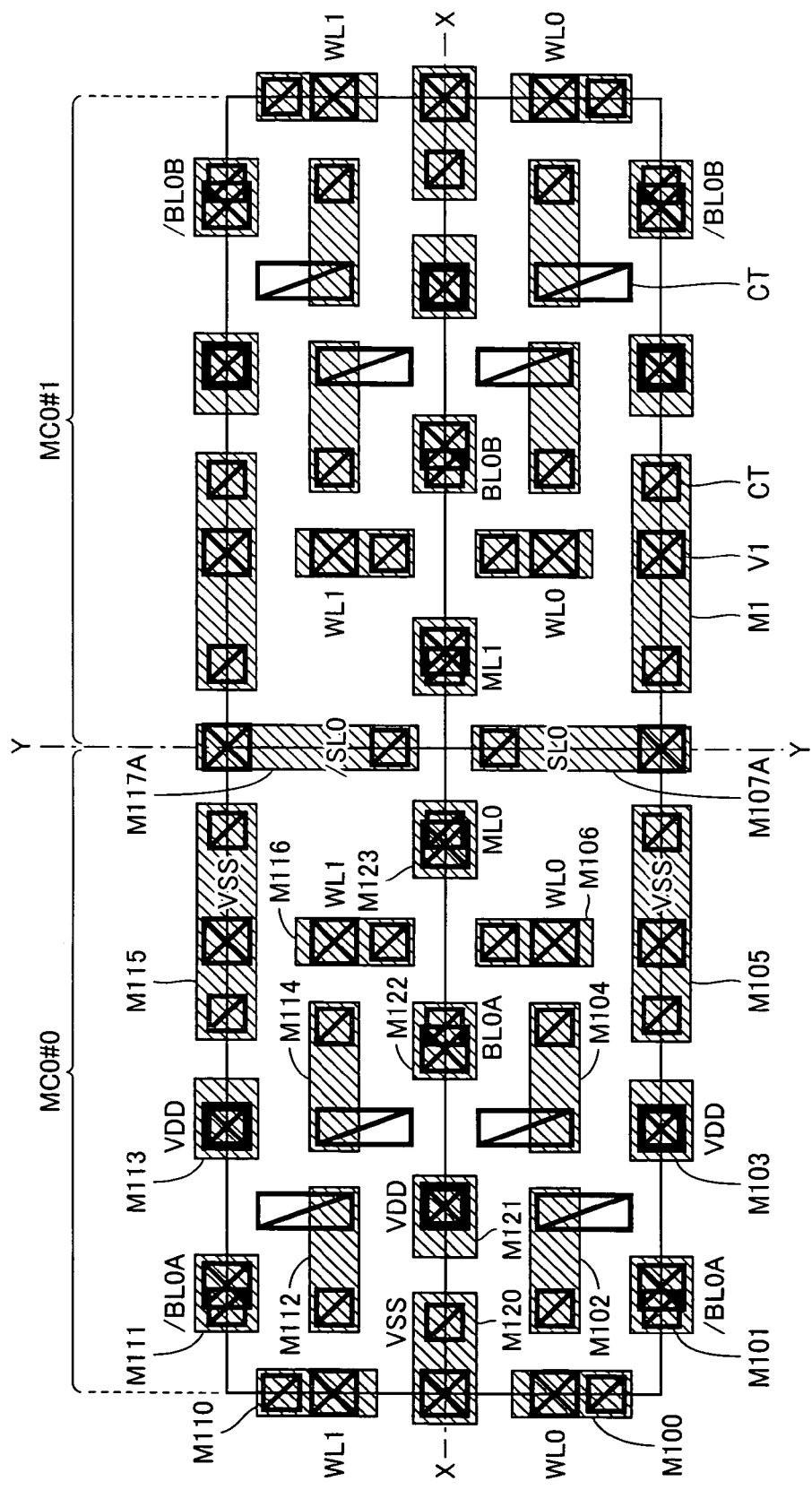
FIG. 13 is a diagram showing the arrangement of a contact hole CT, a first metal interconnection layer M1 and a via hole V1 in the memory array according to the second embodiment.

FIG. 13 is a plan diagram showing the arrangement of a contact hole CT, a first metal interconnection layer M1 and a via hole V1 in the memory cell array according to the second embodiment.

Figure 14:
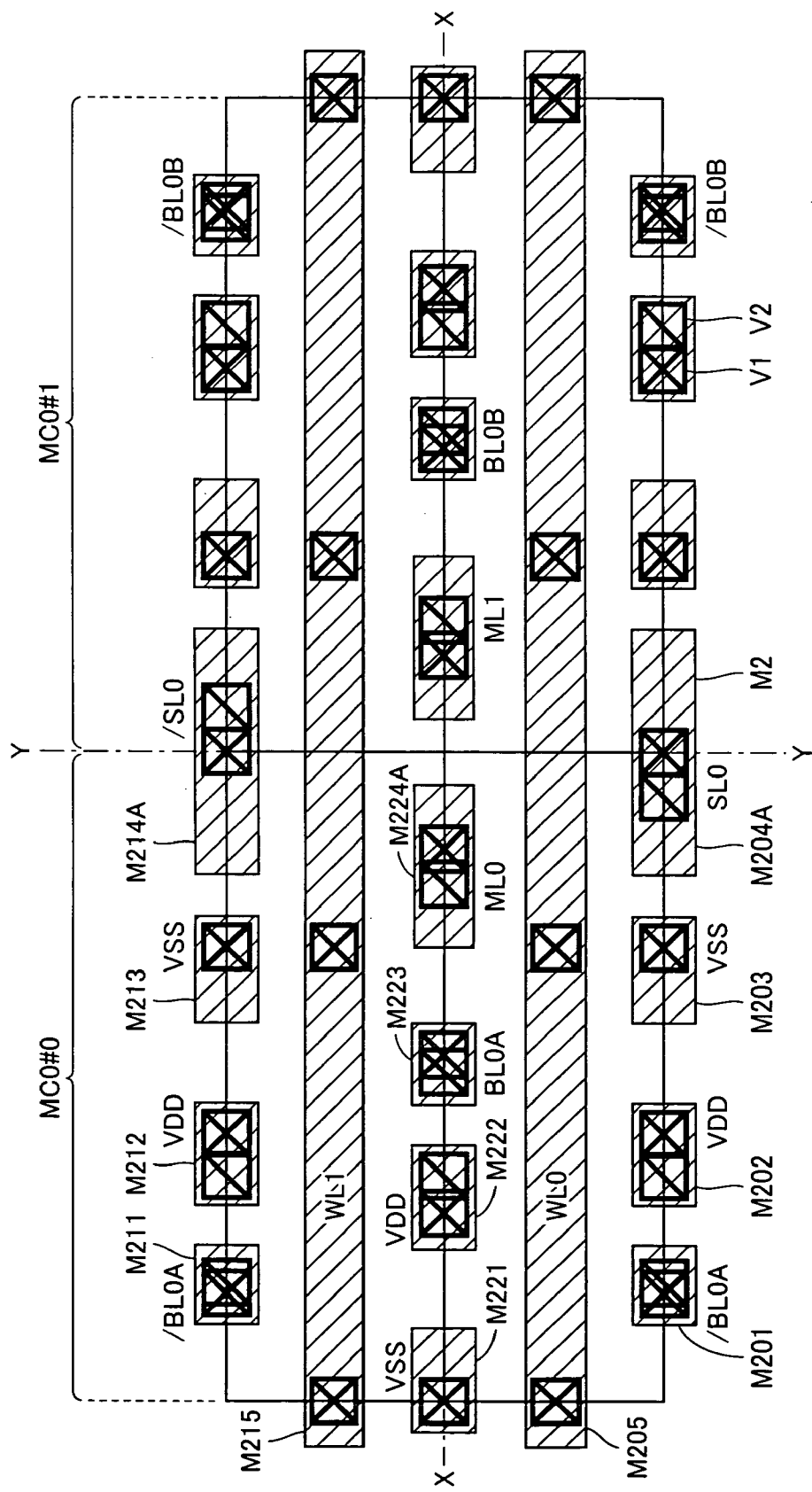
FIG. 14 is a diagram showing the arrangement of a via hole V1, a second metal interconnection layers M2 and a via hole V2 in the memory array according to the second embodiment.

FIG. 14 is a plan diagram showing the arrangement of a via hole V1, a second metal interconnection layer M2 and a via hole V2 in the memory array according to the second embodiment.

FIG. 15 is a plan diagram showing the arrangement of a via hole V2, a third metal interconnection layer M3, a via hole V4 and a fourth metal interconnection layer M4 in the memory array according to the second embodiment.

The pattern of the first metal interconnections of FIG. 13 is different from that of the first embodiment in the portions of first metal interconnections M107A and M117A, and the second metal interconnections shown in FIG. 14 are different from those of the first embodiment in the portions shown as second metal interconnections M204A, M224A and M214A. In addition, the fourth metal interconnections of FIG. 15 are different from those in the first embodiment in that two match lines ML0 and ML1 run in parallel, and third metal interconnections M305A and M321A also have a different form so as to be connected to these match lines. Furthermore, first metal interconnection M306A is also different in that a search line pair is placed in a border portion between memory cells MC0#0 and MC0#1, and the location of via hole V4 for the connection to this search line is also different.

Here, cross sectional diagrams are also described in order to clarify the relationships of the upper and lower interconnection layers.

Figure 16:
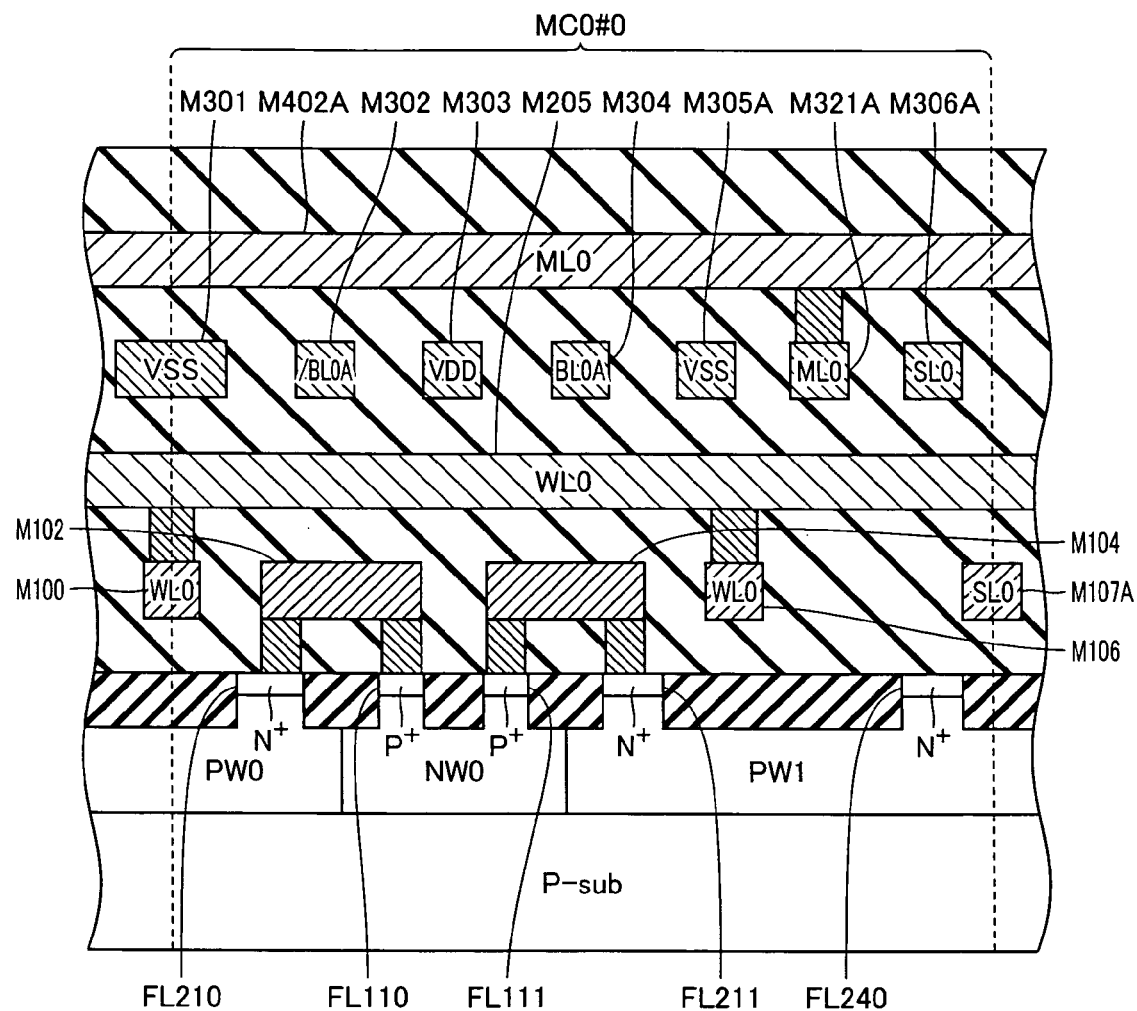
FIG. 16 is a cross sectional diagram along XVI-XVI of FIG. 12.

FIG. 16 is a cross sectional diagram along XVI-XVI of FIG. 12.

Figure 17:
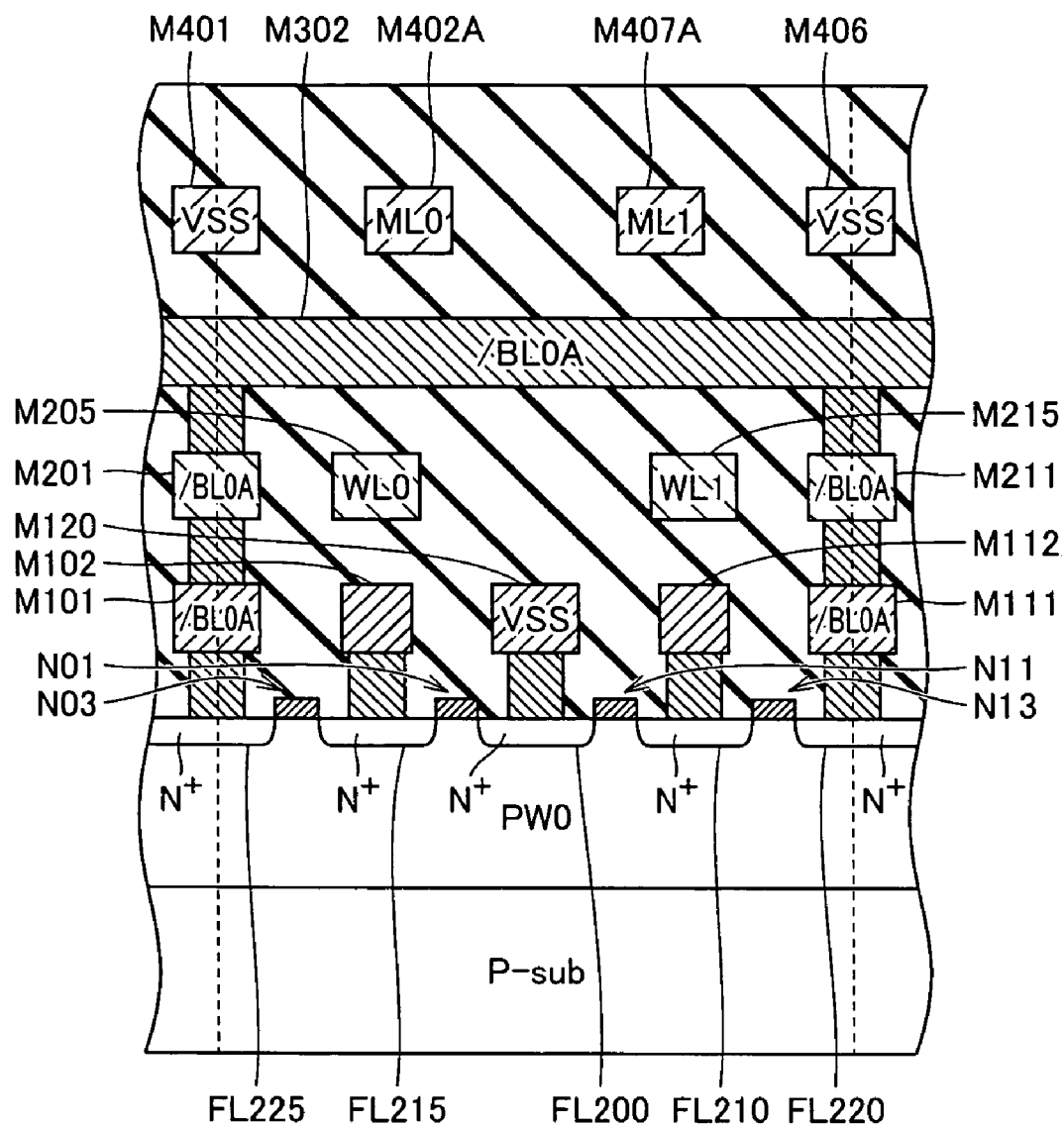
FIG. 17 is a cross sectional diagram along XVII-XVII of FIG. 12.

FIG. 17 is a cross sectional diagram along XVII-XVII of FIG. 12.

With reference to FIG. 16, P wells PW0 and PW1 are formed, and N well NW0 is formed between the P wells on a P substrate where N type impurities are implanted into active regions, thereby forming N type diffusion regions FL210, FL211 and FL240, and P type impurities are implanted into active regions, thereby forming P type diffusion regions FL110 and FL111.

Then, contact holes CT are provided to respective diffusion regions FL210, FL110, FL111 and FL211, and on top of these, first metal interconnections M100, M102, M104, M106 and M107A are formed. First metal interconnection M100 is connected to word line WL0, and in the same manner, first metal interconnection M106 is also connected to word line WL0. In addition, first metal interconnection M107A is connected to search line SL0 via a route not shown. Then, via holes V1 are provided to first metal interconnections M100 and M106, and on top of these, second metal interconnection M205, which becomes word line WL0, is formed.

Third metal interconnections M301, M302, M303, M304, M305A. M321A and M306A are formed above the second metal interconnection layer. Via hole V3 is provided at the top of third metal interconnection M321A, and on top of that, fourth metal interconnection M402A is formed.

This fourth metal interconnection M402A is match line ML0, and third metal interconnection M321A is electrically connected to match line ML0. In addition, third metal interconnections M301 and M305A are grounding lines to which the grounding potential is provided, third metal interconnection M302 is bit line /BL0A, third metal interconnection M304 is bit line BL0A, and third metal interconnection M306A is search line SL0.

Next, the cross sectional diagram along a line in the direction of the Y axis of FIG. 17 is described. First, P well PW0 is formed on a P substrate, a gate oxide film and polysilicon gates are formed, and in addition, N type impurities are implanted into active regions of these, and thereby, the sources and the drains are formed as N type diffusion regions FL225, FL215, FL200, FL210 and FL220, and thus, N channel MOS transistors N03, N01, N11 and N13 are formed.

Plugs are formed within respective contact holes CT in N type diffusion regions FL225, FL215, FL200, FL210 and FL220, and on top of these plugs, first metal interconnections M101, M102, M120, M112 and Mill are formed. Here, first metal interconnection M101 is electrically connected to bit line /BL0A, first metal interconnection M120 is electrically coupled to grounding potential VSS, and first metal interconnection M111 is electrically connected to bit line /BL0A. In addition, first metal interconnections M102 and M112 form internal storage nodes.

Via holes are provided at the top of first metal interconnections M101 and M111, and on top of these, second metal interconnections M201 and M211 are formed. In addition, second metal interconnections M205 and M215 are formed together. Second metal interconnection M201 is electrically connected to bit line /BL0A, and second metal interconnection M205 is electrically connected to word line WL0. In addition, second metal interconnection M215 is electrically connected to word line WL1, and second metal interconnection M211 is electrically connected to bit line /BL0A. Via holes are provided at the top of second metal interconnections M201 and M211, and on top of these, third metal interconnection M302 is formed. This third metal interconnection M302 is a bit line BL0A.

Furthermore, fourth metal interconnections M401, M402A, M407A and M406 are formed above the third metal interconnection. Fourth metal interconnections M401 and M406 are grounding lines VSS, fourth metal interconnection M402A is match line ML0, and fourth metal interconnection M407A is match line ML1.

As described above, the area occupied by a memory array can further be reduced, and the manufacturing cost can also be reduced, in comparison with the first embodiment by adopting the memory array configuration shown in the second embodiment. In addition, the number of small pieces of polysilicon in the pattern can be reduced, and a reduction in the manufacturing cost due to an increase in the yield can be expected.

In addition, bit line pairs that run in parallel are provided with VDD and VSS lines between them in the same manner as in the layout shown in the first embodiment, and thereby, the coupling capacitance between bit lines can be prevented from causing a malfunction.

Third Embodiment

The semiconductor memory device according to the third embodiment has the same circuit configuration and the same arrangement of the cells in the memory array as those shown in FIGS. 9 and 10 of the semiconductor memory device according to the second embodiment, but a different arrangement of the transistors inside the memory cells as well as different interconnection layers for search lines and word lines.

FIGS. 18 to 21 are plan diagrams showing the internal layout of the memory cells according to the third embodiment. In order to make understanding easier, cross sections along several layers across the entirety, which include the layer where transistors are formed and a plurality of interconnection layers, are shown in the same manner as in the first and second embodiments.

Figure 18:
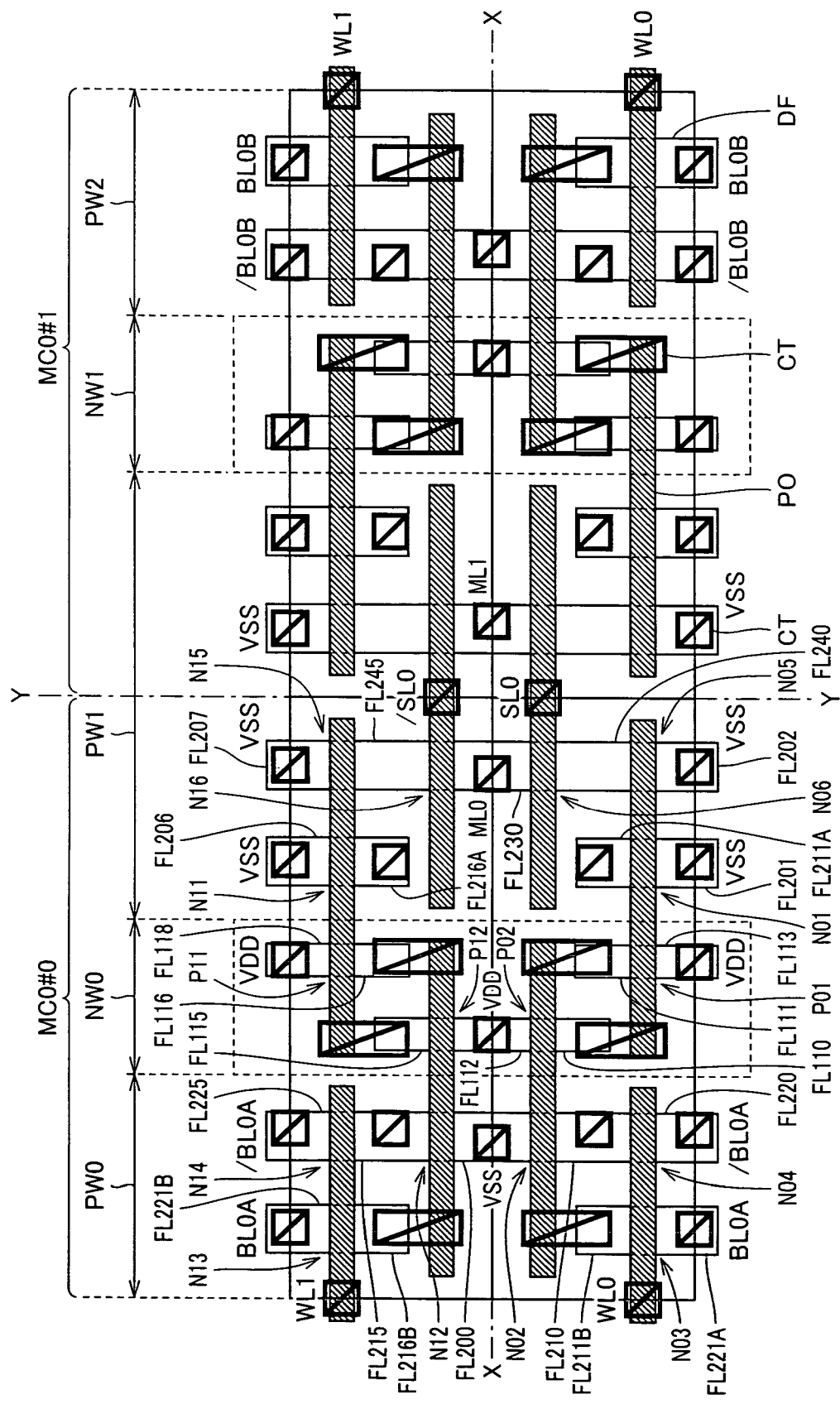
FIG. 18 is a plan diagram showing the arrangement of a well, a diffusion region DF, polysilicon PO and a contact hole CT in a memory cell according to a third embodiment.

FIG. 18 is a plan diagram showing the arrangements of a well, a diffusion region DF, polysilicon PO and a contact hole CT of a memory cell according to the third embodiment.

As can be seen by the comparison of FIG. 18 with FIG. 12 according to the second embodiment, the width of P well PW0 in the direction along the X axis is wider, and the width of P well PW1 is narrower.

In addition, N type diffusion regions FL201 and FL211A, as well as N channel MOS transistor N01, remain inside P well PW1. N type diffusions regions FL221A and FL211B, as well as N channel MOS transistor N03, are formed inside P well PW0 instead of P well PW1.

In addition, N type diffusion regions FL206 and FL216A, as well as N channel MOS transistor N11, remain inside P well PW1. N type diffusion regions FL221B and FL216B, as well as N channel MOS transistor N13, are formed inside P well PW0 instead of P well PW1.

The other portions in FIG. 18 are the same as those in FIG. 12 according to the second embodiment, and therefore, the descriptions thereof are not repeated.

As shown in FIG. 18, the arrangement of the transistors has been changed, and therefore, the interconnection layers are also changed as described below.

Figure 19:
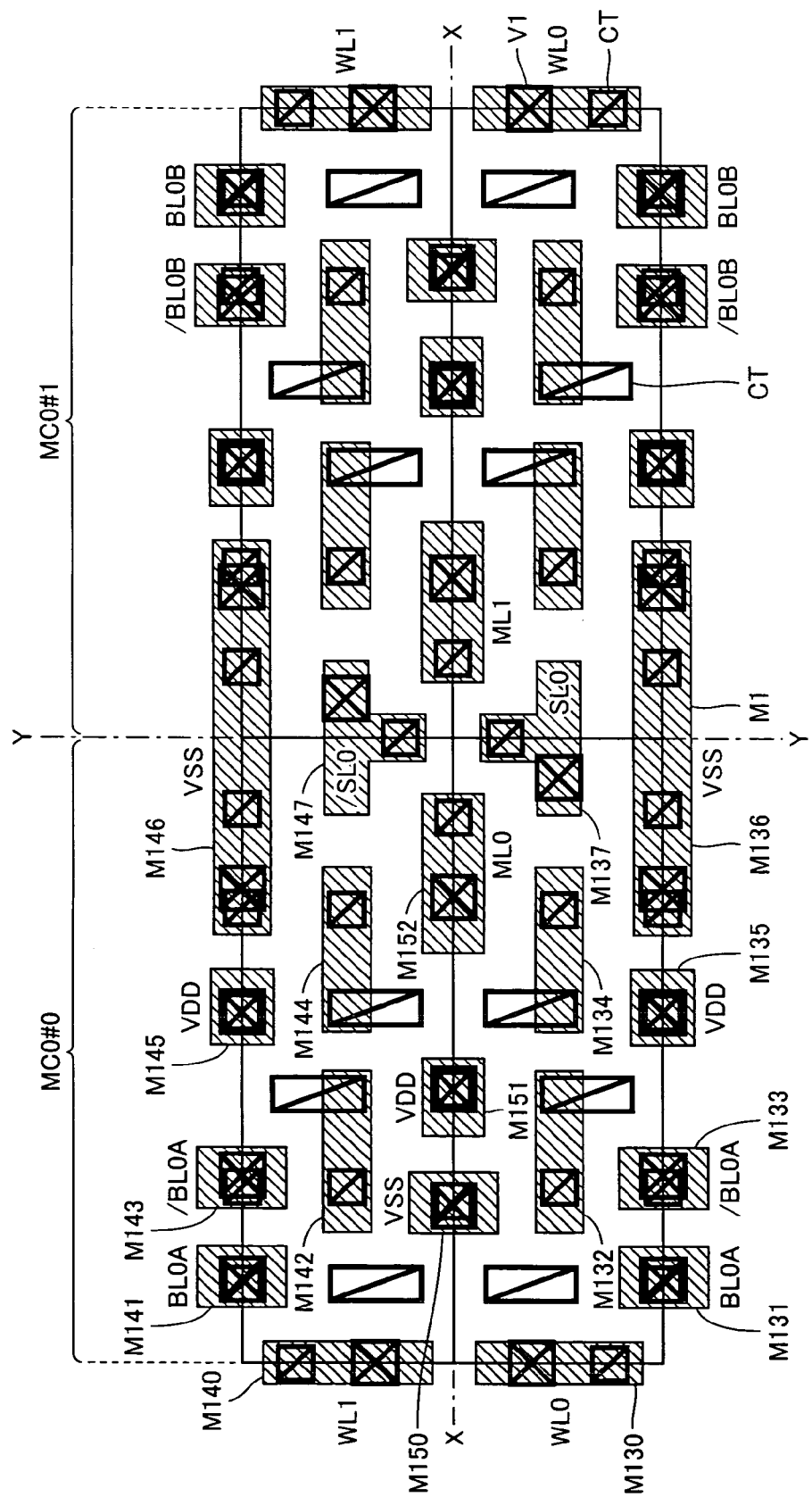
FIG. 19 is a plan diagram showing the arrangement of a contact hole CT, a first metal interconnection layer M1 and a first via hole V1 in a memory cell according to the third embodiment.

FIG. 19 is a plan diagram showing the arrangement of a contact hole CT, a first metal interconnection layer M1 and a first via hole V1 of a memory cell according to the third embodiment.

Figure 20:
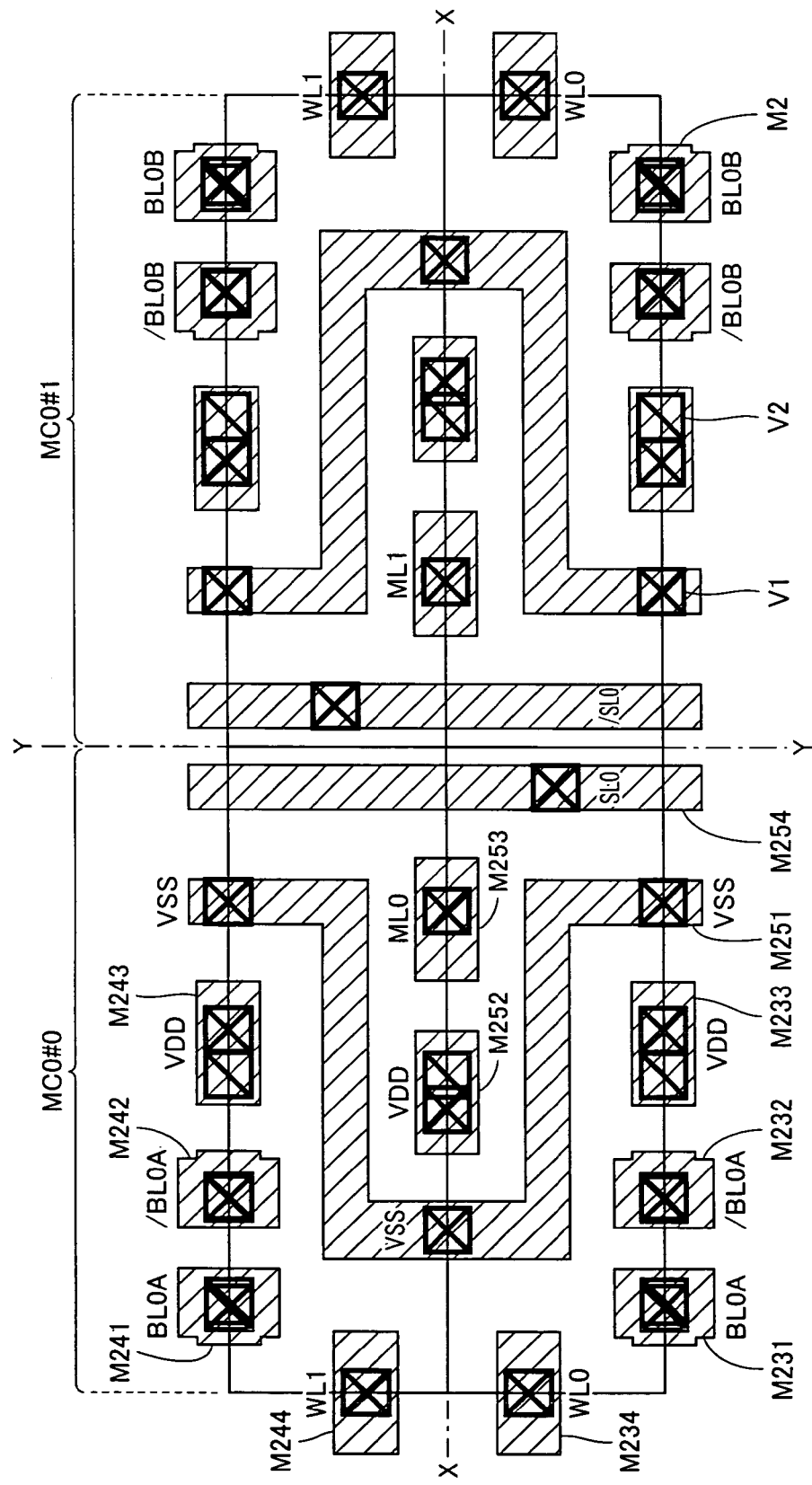
FIG. 20 is a plan diagram showing the arrangement of a first via hole V1, a second metal interconnection layer M2 and a second via hole V2 in a memory cell according to the third embodiment.

FIG. 20 is a plan diagram showing the arrangement of a first via hole V1, a second metal interconnection layer M2 and a second via hole V2 of a memory cell according to the third embodiment.

Figure 21:
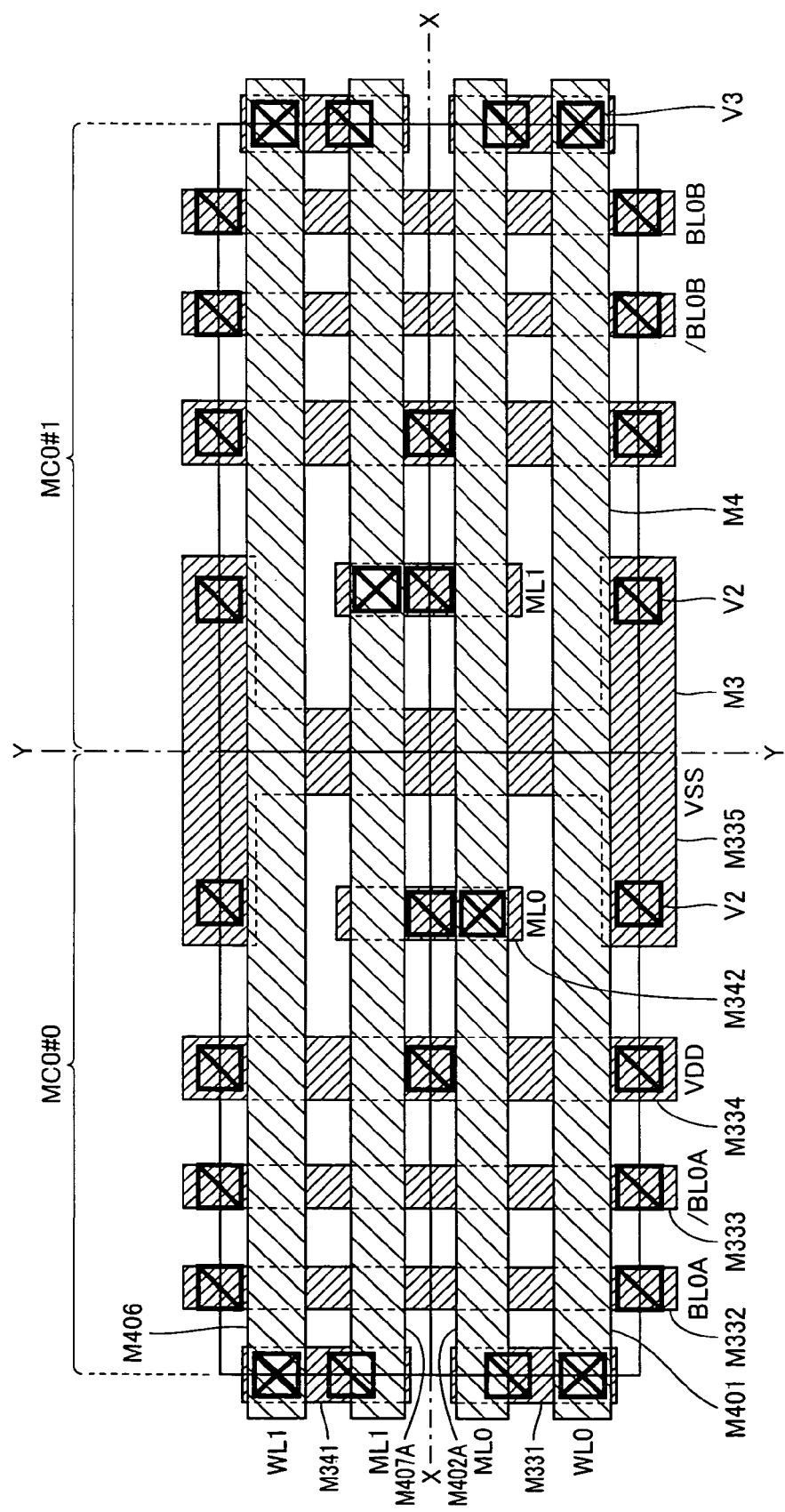
FIG. 21 is a plan diagram showing the arrangement of a second via hole V2, a third metal interconnection layer M3, a third via hole V3 and a fourth metal interconnection layer M4 in a memory cell according to the third embodiment.

FIG. 21 is a plan diagram showing the arrangement of a second via hole V2, a third metal interconnection layer M3, a third via hole V3 and a fourth metal interconnection layer M4 of a memory cell according to the third embodiment.

A first metal interconnection M130 of FIG. 19 is electrically connected to word line WL0, connected to the gate of N channel MOS transistor N03 of FIG. 18 via contact hole CT, and connected to a second metal interconnection M234 of FIG. 20 via first via hole V1. Second metal interconnection M234 is connected to a third metal interconnection M331 of FIG. 21 via second via hole V2. Third metal interconnection M331 is connected to word line WL0, which is formed of a fourth metal interconnection layer that extends along the direction of the X axis, via third via hole V3.

A first metal interconnection M131 of FIG. 19 is electrically connected to bit line BL0A, connected to N type diffusion region FL221A of FIG. 18 via contact hole CT, and connected to a second metal interconnection M231 of FIG. 20 via first via hole V1. Second metal interconnection M231 is connected to a third metal interconnection M332 of FIG. 21 via second via hole V2. Third metal interconnection M332 is bit line BL0A which crosses memory cell MC0#0 in the direction along the Y axis.

A first metal interconnection M133 of FIG. 19 is electrically connected to bit line /BL0A, connected to N type diffusion region FL220 of FIG. 18 via contact hole CT, and connected to a second metal interconnection M232 of FIG. 20 via first via hole V1. Second metal interconnection M232 is connected to a third metal interconnection M333 of FIG. 21 via second via hole V2. Third metal interconnection M333 is a bit line /BL0A which crosses memory cell MC0#0 in the direction along the Y axis.

A first metal interconnection M132 of FIG. 19 is an internal storage node and connects N type diffusion region FL210 of FIG. 18 to P type diffusion region FL110 via contact holes CT. In addition, first metal interconnection M134 of FIG. 19 is an internal storage node and connects N type diffusion region FL211A of FIG. 18 to P type diffusion region FL111 via contact holes CT.

A first metal interconnection M135 of FIG. 19 is electrically connected to power supply line VDD, connected to N type diffusion region FL113 of FIG. 18 via contact hole CT, and connected to a second metal interconnection M233 of FIG. 20 via first via hole V1. Second metal interconnection M233 is connected to a third metal interconnection M334 of FIG. 21 via second via hole V2. Third metal interconnection M334 is power supply line VDD which crosses memory cell MC0#0 in the direction along the Y axis.

A first metal interconnection M136 of FIG. 19 is electrically connected to grounding line VSS, connected to N type diffusion regions FL201 and FL202 of FIG. 18 via contact holes CT, and connected to a second metal interconnection M251 of FIG. 20 via first via hole V1. Second metal interconnection M251 is connected to a third metal interconnection M335 of FIG. 21 via second via hole V2. Third metal interconnection M335 is a grounding line VSS which crosses memory cell MC0#0 in the direction along the Y axis.

A first metal interconnection M137 of FIG. 19 is electrically connected to search line SL0, connected to the gate of N channel MOS transistor N06 of FIG. 18 via contact hole CT, and connected to a second metal interconnection M254 of FIG. 20 via first via hole V1. Second metal interconnection M254 is search line SL0 which crosses memory cell MC0#0 in the direction along the Y axis.

A first metal interconnection M150 of FIG. 19 is electrically connected to grounding line VSS, connected to N type diffusion region FL200 of FIG. 18 via contact hole CT, and connected to a second metal interconnection M251 of FIG. 20 via first via hole V1. Second metal interconnection M254 is grounding line VSS which meanders across memory cell MC0#0 in the direction along the Y axis.

A first metal interconnection M151 of FIG. 19 is electrically connected to power supply line VDD, connected to P type diffusion region FL112 of FIG. 18 via contact hole CT, and connected to a second metal interconnection M252 of FIG. 20 via first via hole V1. Second metal interconnection M252 is connected to a third metal interconnection M334 of FIG. 21 via second via hole V2. Third metal interconnection M334 is a power supply line VDD which crosses memory cell MC0#0 along the direction the Y axis.

A first metal interconnection M152 of FIG. 19 is electrically connected to match line ML0, connected to N type diffusion region FL230 of FIG. 18 via contact hole CT, and connected to a second metal interconnection M253 of FIG. 20 via first via hole V1. Second metal interconnection M253 is connected to a third metal interconnection M342 of FIG. 21 via second via hole V2. Third metal interconnection M342 is connected to match line ML0, which is formed of a fourth metal interconnection layer that extends along the direction of the X axis, via third via hole V3.

A first metal interconnection M140 of FIG. 19 is electrically connected word line WL1, connected to the gate of N channel MOS transistor N13 of FIG. 18 via contact hole CT, and connected to a second metal interconnection M244 of FIG. 20 via first via hole V1. Second metal interconnection M244 is connected to a third metal interconnection M341 of FIG. 21 via second via hole V2. Third metal interconnection M341 is connected to word line WL1, which is formed of a fourth metal interconnection layer that extends along the direction of the X axis, via third via hole V3.

A first metal interconnection M141 of FIG. 19 is electrically connected to bit line BL0A, connected to N type diffusion region FL221B of FIG. 18 via contact hole CT, and connected to a second metal interconnection M241 of FIG. 20 via first via hole V1. Second metal interconnection M241 is connected to third metal interconnection M332 of FIG. 21 via second via hole V2. Third metal interconnection M332 is bit line BL0A which crosses memory cell MC0#0 in the direction along the Y axis as described above.

A first metal interconnection M143 of FIG. 19 is electrically connected to bit line /BL0A, connected to N type diffusion region FL225 of FIG. 18 via contact hole CT, and connected to a second metal interconnection M242 of FIG. 20 via first via hole V1. Second metal interconnection M242 is connected to third metal interconnection M333 of FIG. 21 via second via hole V2. Third metal interconnection M333 is bit line /BL0A which crosses memory cell MC0#0 in the direction along the Y axis as described above.

A first metal interconnection M142 of FIG. 19 is an internal storage node and connects N type diffusion region FL215 of FIG. 18 to P type diffusion region FL115 via contact holes CT. In addition, a first metal interconnection M144 of FIG. 19 is an internal storage node and connects N type diffusion region FL216A of FIG. 18 to P type diffusion region FL116 via contact holes CT.

A first metal interconnection M145 of FIG. 19 is electrically connected to power supply VDD, connected to N type diffusion region FL118 of FIG. 18 via contact hole CT, and connected to a second metal interconnection M243 of FIG. 20 via first via hole V1. Second metal interconnection M243 is connected to third metal interconnection M334 of FIG. 21 via second via hole V2. Third metal interconnection M334 is power supply line VDD which crosses memory cell MC0#0 in the direction along the Y axis as described above.

A first metal interconnection M146 of FIG. 19 is electrically connected to grounding line VSS, connected to N type diffusion regions FL206 and FL207 of FIG. 18 via contact holes CT, and connected to a second metal interconnection M251 of FIG. 20 via first via hole V1. Second metal interconnection M251 is connected to third metal interconnection M335 of FIG. 21 via second via hole V2 as described above. This third metal interconnection M335 is grounding line VSS which crosses memory cell MC0#0 in the direction along the Y axis as described above.

A first metal interconnection M147 of FIG. 19 is electrically connected to search line /SL0, connected to the gate of N channel MOS transistor N16 of FIG. 18 via contact hole CT, and connected to search line /SL0, which is formed of a second metal interconnection layer of FIG. 20 and crosses memory cell MC0#0 in the direction along the Y axis, via first via hole V1.

Here, though memory cell MC0#1 is different from memory cell MC0#0 in that the corresponding bit lines are connected to memory cell MC0#1, memory cell MC0#1 has an arrangement of transistors, diffusion regions and interconnections in line symmetry with memory cell MC0#0 across the Y axis, and therefore, the descriptions of the layout are not repeated.

Such a transistor arrangement is adopted in the third embodiment, and thus, search line pairs are wired in the second metal interconnection layer. As a result, the coupling capacitance in the portions which relay second via holes can be reduced, and thereby, the capacitance of interconnections in search line pairs can be reduced in comparison with the second embodiment, and an additional reduction in the consumed power and an increase in the speed can be realized. Bit lines and search lines are shielded by grounding lines VSS and are located in different interconnection layers, and therefore, a malfunction can be prevented from being caused by coupling noise.

Fourth Embodiment

The semiconductor memory device according to the fourth embodiment has the same circuit configuration and the same arrangement of the cells in the memory array as those shown in FIGS. 9 and 10 of the semiconductor memory device according to the second embodiment, but has a different transistor arrangement inside the memory cells.

FIGS. 22 to 25 are plan diagrams showing the internal layout of the memory cells according to the fourth embodiment. In order to make understanding easier, the entire layers, which include the layer where transistors are formed and a plurality of interconnection layers, are shown by dividing several layer groups in the same manner as in the first to third embodiments.

Figure 22:
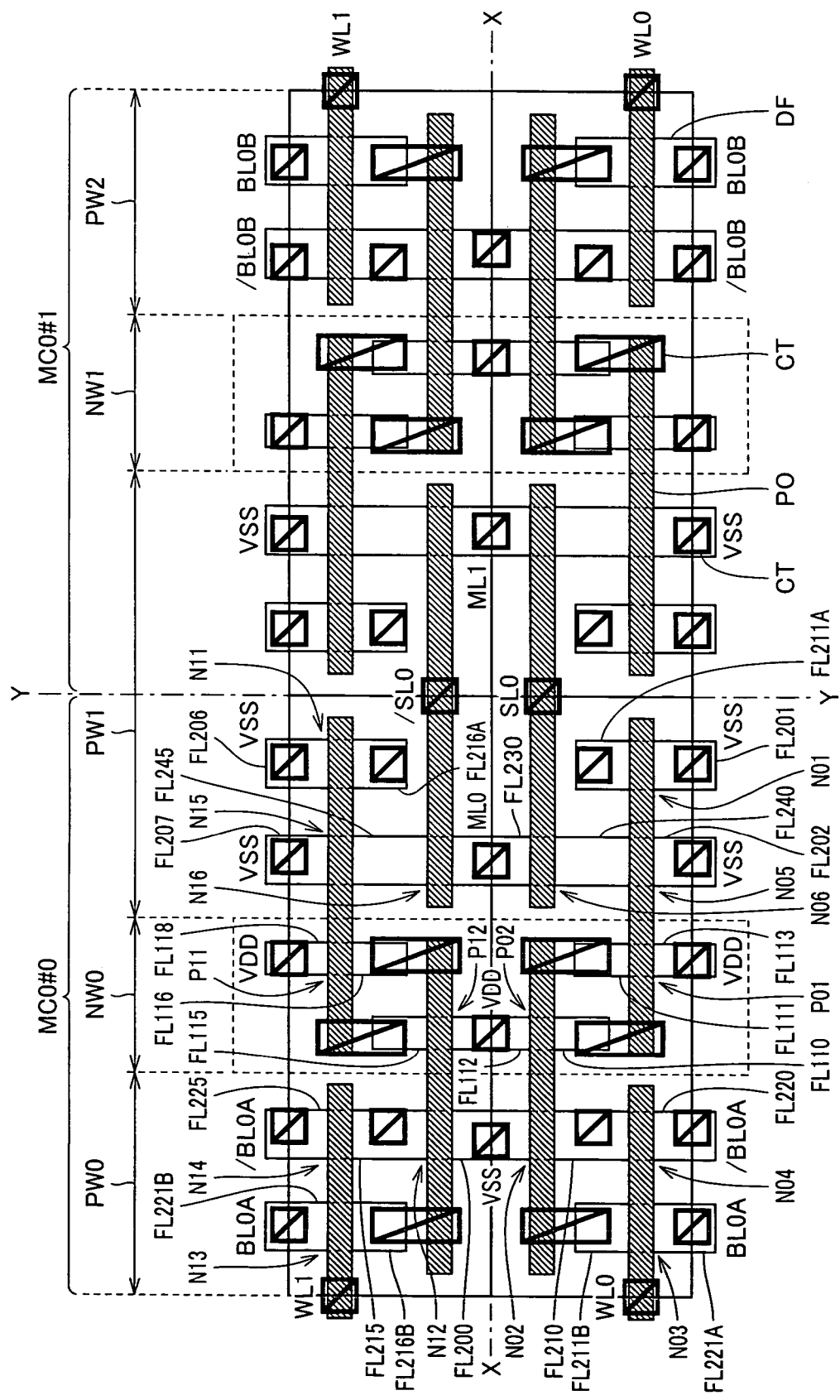
FIG. 22 is a plan diagram showing the arrangement of a well, a diffusion region DF, polysilicon PO and a contact hole CT in a memory cell according to a fourth embodiment.

FIG. 22 is a plan diagram showing the arrangement of wells, diffusion regions DF, polysilicon PO and contact hole CT of memory cells according to the fourth embodiment.

The transistor arrangement of the fourth embodiment is gained by partially changing the transistor arrangement of the third embodiment. As can be seen by comparing FIG. 22 with FIG. 18 of the third embodiment, the locations of N channel MOS transistor N01, as well as N type diffusion regions FL201 and FL211A, are switched with the locations of N channel MOS transistors N05 and N06, as well as N type diffusion regions FL202, FL240 and FL230, within memory cell MC0#0. In addition, the locations of N channel MOS transistor N11, as well as N type diffusion regions FL206 and FL216A, are also switched with the locations of N channel MOS transistors N15 and N16, as well as N type diffusion regions FL207 and FL245.

The arrangements of the transistors and the like in the other portions of FIG. 22 are the same as the arrangements of FIG. 18, and therefore, the descriptions thereof are not repeated.

Together with such a change in the arrangements of transistors, the interconnection portions in the upper layer of the fourth embodiment are also slightly different from those of the third embodiment.

Figure 23:
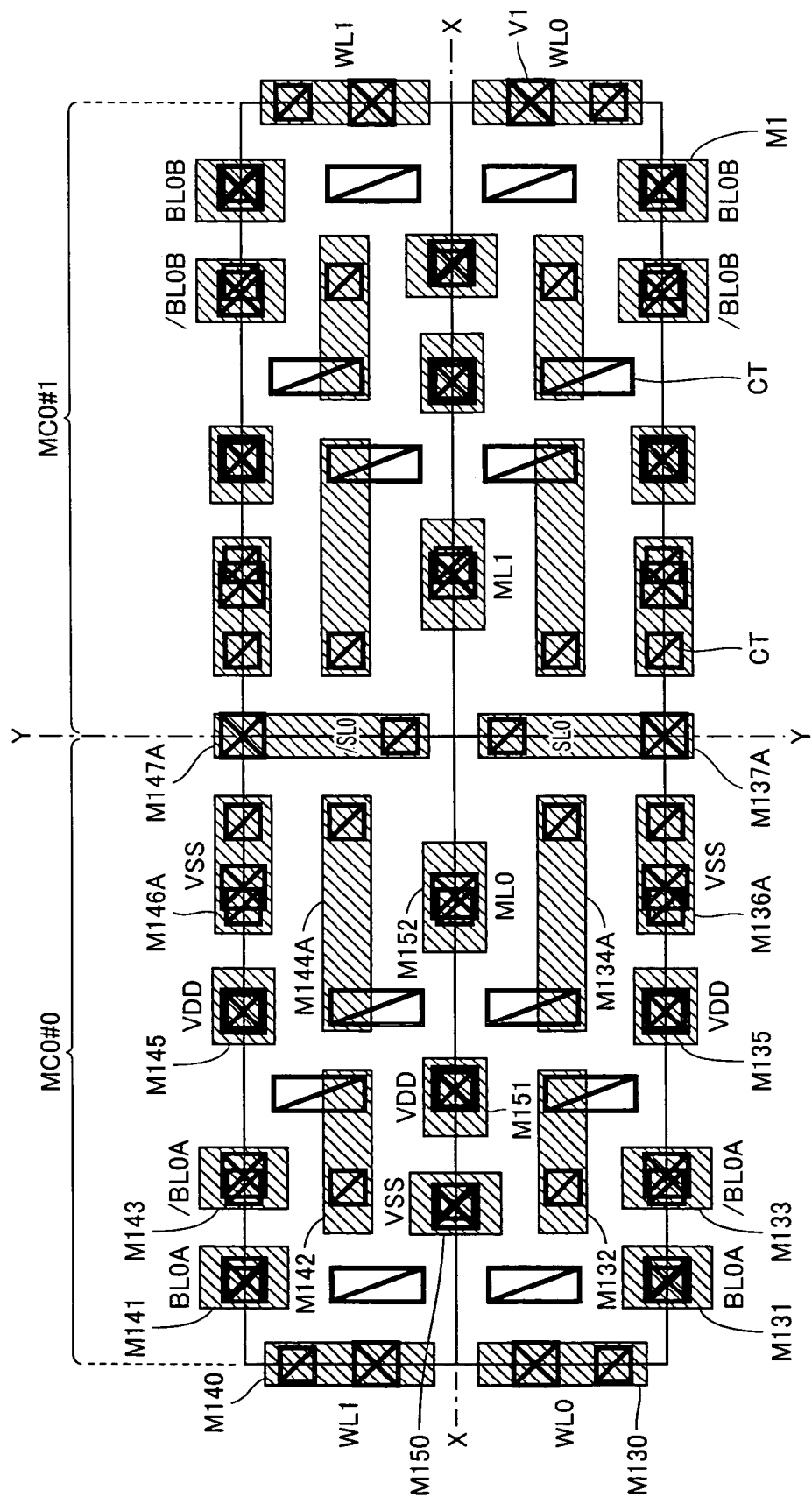
FIG. 23 is a plan diagram showing the arrangement of a contact hole CT, a first metal interconnection layer M1 and a first via hole V1 in a memory cell according to the fourth embodiment.

FIG. 23 is a plan diagram showing the arrangement of a contact hole CT, a first metal interconnection layer M1 and a first via hole V1 of a memory cell according to the fourth embodiment.

Figure 24:
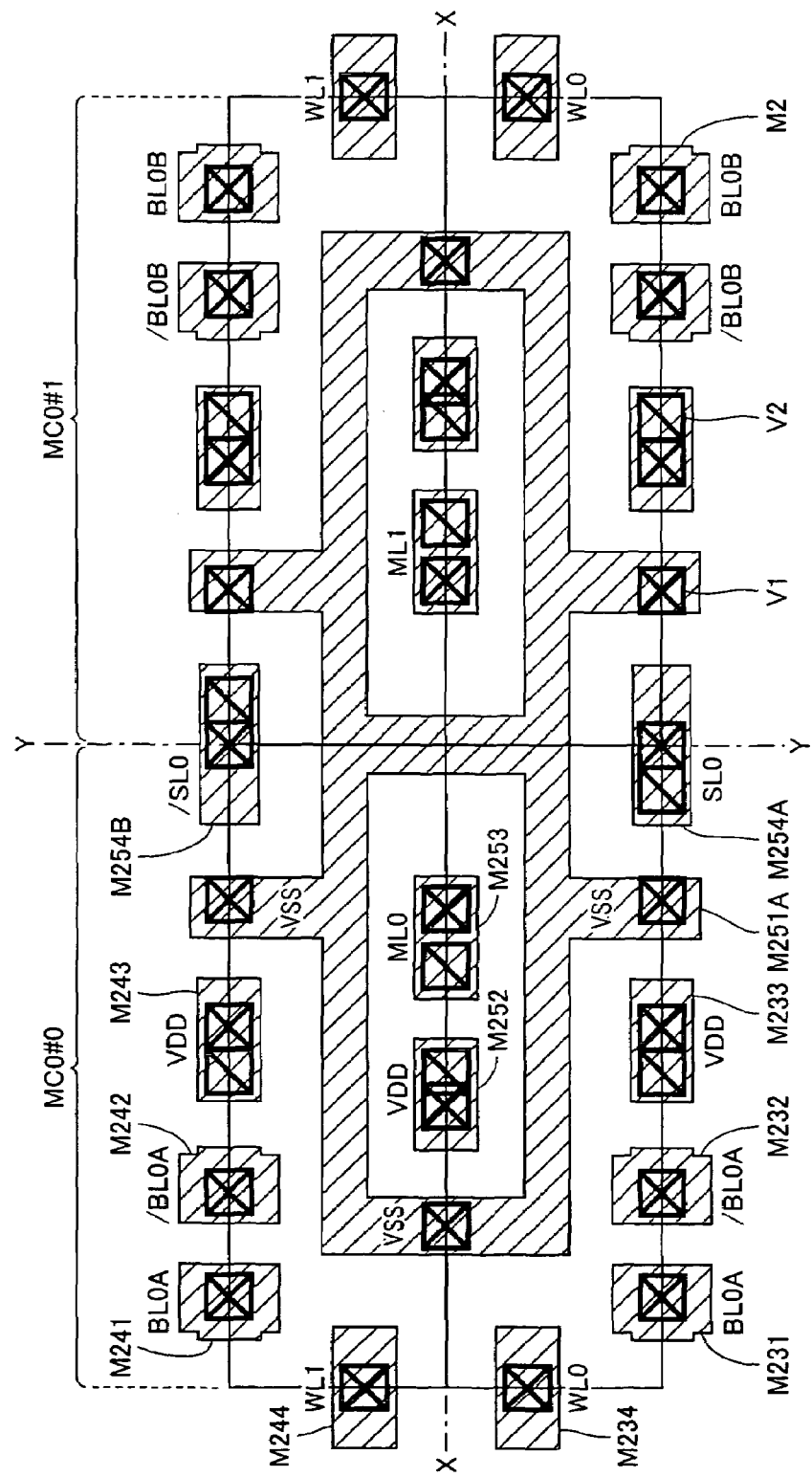
FIG. 24 is a plan diagram showing the arrangement of a first via hole V1, a second metal interconnection layer M2 and a second via hole V2 in a memory cell according to the fourth embodiment.

FIG. 24 is a plan diagram showing the arrangement of a first via hole V1, a second metal interconnection layer M2 and a second via hole V2 of a memory cell according to the fourth embodiment.

Figure 25:
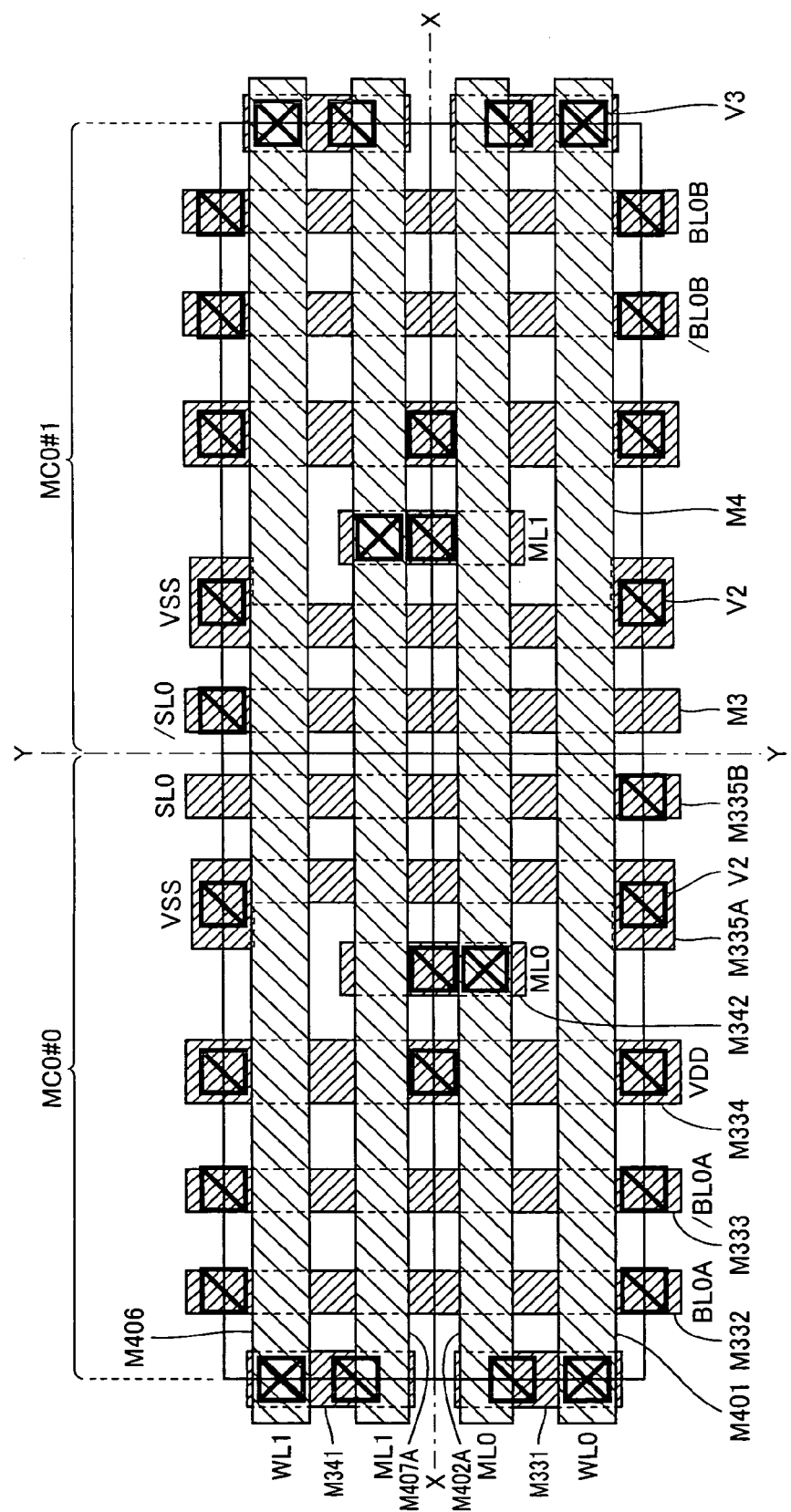
FIG. 25 is a plan diagram showing the arrangement of a second via hole V2, a third metal interconnection layer M3, a third via hole V3 and a fourth metal interconnection layer M4 in a memory cell according to the fourth embodiment.
Figure 26:
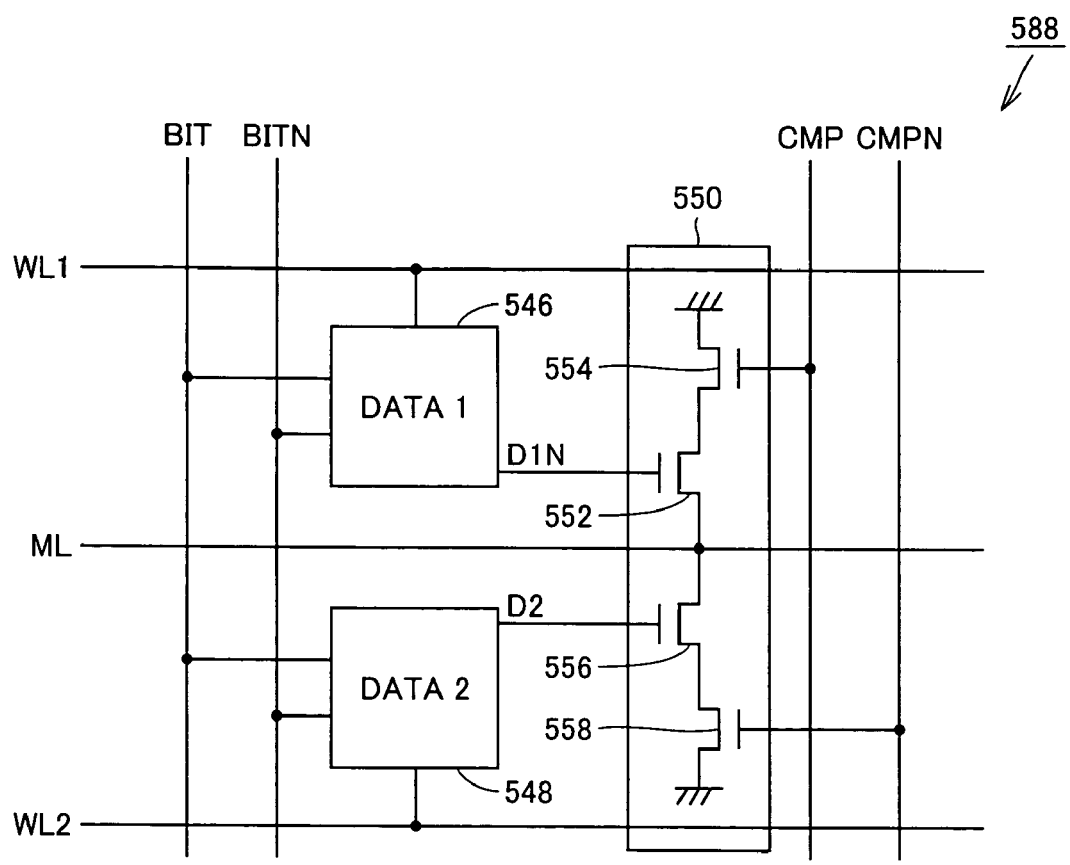
FIG. 26 is a circuit diagram showing the configuration of a memory cell used in TCAM's according to the prior art.

FIG. 25 is a plan diagram showing the arrangement of a second via hole V2, a third metal interconnection layer M3, a third via hole V3 and a fourth metal interconnection layer M4 of a memory cell according to the fourth embodiment.

In the following, only the portions which are different from those of the third embodiment are described. A first metal interconnection M134A of FIG. 23 is an internal storage node, and connects N type diffusion region FL211A of FIG. 22 to P type diffusion region FL111 via contact holes CT.

A first metal interconnection M136A of FIG. 23 is electrically connected to grounding line VSS, connected to N type diffusion regions FL201 and FL202 of FIG. 22 via contact holes CT, and connected to a second metal interconnection M251A of FIG. 24 via first via hole V1. Second metal interconnection M251A is connected to a third metal interconnection M335A of FIG. 25 via second via hole V2. Third metal interconnection M335A is a grounding line VSS which crosses memory cell MC0#0 in the direction along the Y axis.

A first metal interconnection M137A of FIG. 23 is electrically connected to search line SL0, connected to the gate of N channel MOS transistor N06 of FIG. 22 via contact hole CT, and connected to a second metal interconnection M254A of FIG. 24 via first via hole V1. In addition, second metal interconnection M254A is connected to a third metal interconnection M335B of FIG. 25 via second via hole V2. Third metal interconnection M33 is a search line SL0 which crosses memory cell MC0#0 in the direction along the Y axis.

A first metal interconnection M144A is an internal storage node, and connects N type diffusion region FL216A of FIG. 22 to P type diffusion region FL116 via contact holes CT.

A first metal interconnection M146A of FIG. 23 is electrically connected to grounding line VSS, connected to N type diffusion regions FL206 and FL207 of FIG. 22 via contact holes CT, and connected to second metal interconnection M251A of FIG. 24 via first via hole V1. Second metal interconnection M251A is connected to third metal interconnection M335A of FIG. 25 via second via hole V2 as described above. Third metal interconnection M335A is a grounding line VSS which crosses memory cell MC0#0 in the direction along the Y axis as described above.

A first metal interconnection M147A of FIG. 23 is electrically connected to search line /SL0, connected to the gate of N channel MOS transistor N16 of FIG. 22 via contact hole CT, and connected to a second metal interconnection M254B of FIG. 24 via first via hole V1. In addition, second metal interconnection M254B is connected to search line /SL0, which is formed of a third metal interconnection layer that crosses memory cell MC0#0 of FIG. 25 in the direction along the Y axis, via second via hole V2.

Here, the arrangement of the interconnection layers in the other portions within memory cell MC0#0 are the same as the arrangement according to the third embodiment, and therefore, the descriptions thereof are not repeated. In addition, though memory cell MC0#L is different from memory cell MC0#0 in that the corresponding bit lines are connected to memory cell MC0#0, the arrangement of the transistors, the diffusion regions and the interconnections in memory cell MC0#1 is in line symmetry with the arrangement of memory cell MC0#0 across the Y axis, and therefore, the descriptions of the layout are not repeated.

Such a transistor arrangement is adopted in the fourth embodiment, and thereby, the forms of the active regions in P wells PW0 and PW1 become line symmetric across N well NW0 in the center. As a result, the conditions for processing become equal between the left and right sides, and an increase in the process precision can be expected. In addition, in the same manner as in the third embodiment, the bit lines and the search lines are shielded by grounding lines VSS and are in different interconnection layers, and thereby, a malfunction can be prevented from being caused by coupling noise.

Here, the present invention can also be applied to semiconductor memory devices formed in SOI (silicon on insulator), and in this case, N wells correspond to P type MOS transistor regions, and P wells correspond to N type MOS transistor regions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising a plurality of memory cells arranged in rows and columns, each memory cell being configured to hold information of two bits and including:
   a first cell capable of holding information of one bit;
   a second cell capable of holding information of one bit and placed adjacent to said first cell in a direction of said columns;
   a bit line pair extending along the direction of said columns and connected to both of said first and second cells;
   first and second word lines extending along a direction of said rows and connected to said first and second cells, respectively; and
   a logical operation cell placed adjacent, in the direction of said rows, to both of said first and second cells extending along the direction of the columns, and outputting results based on search data and information held in said first and second cells, wherein
   a gate of a transistor forming each of said plurality of memory cells extends along the direction of said rows, and
   a region where each of said plurality of memory cells is formed includes first to third wells aligned in this order along the direction of said rows, and said first and third wells are of a first conductivity type and said second well sandwiched between said first and third wells is of a second conductivity type.

2. The semiconductor memory device according to claim 1, wherein
   each of said plurality of memory cells further includes
   a search line pair for transferring said search data extending along the direction of said columns and connected to said logical operation cell, and
   a match line extending along the direction of said rows and connected to said logical operation cell.

3. The semiconductor memory device according to claim 2, wherein
   said first and second word lines are formed of a first metal interconnection layer,
   said search line pair is formed of a second metal interconnection layer,
   said match line is formed of a third metal interconnection layer,
   said first metal interconnection layer is located beneath said third metal interconnection layer, and
   said third metal interconnection layer is located above said second metal interconnection layer.

4. The semiconductor memory device according to claim 2, wherein
   said search line pair is formed of a first metal interconnection layer,
   said first and second word lines and said match line are formed of a second metal interconnection layer, and
   said first metal interconnection layer is located beneath said second metal interconnection layer.

5. The semiconductor memory device according to claim 1, wherein
   first and second memory cells among said plurality of memory cells that are adjacent to each other in the direction of said rows further include
   a search line pair for transferring said search data extending in a border portion between said first and second memory cells along the direction of said columns, and shared by and connected to logical operation cells of said first and second memory cells.

6. The semiconductor memory device according to claim 5, wherein
   said logical operation cell of said first memory cell is connected to a first match line crossing said first and second memory cells that are adjacent to each other along the direction of the rows, and
   said logical operation cell of said second memory cell is connected to a second match line crossing said first and second memory cells that are adjacent to each other in the direction of the rows.

7. A semiconductor memory device, comprising:
   first and second memory cells placed adjacent to each other in a direction of rows, each of said first and second memory cells including
   a first cell being configured to hold information of one bit,
   a second cell being configured to hold information of one bit and placed adjacent to said first cell in a direction of columns, and
   a logical operation cell placed adjacent, in the direction of said rows, to both of said first and second cells extending along the direction of said columns, and outputting results based on search data and information held in said first and second cells;
   first and second word lines extending along the direction of said rows and connected to said first and second cells, respectively, in each of said first and second memory cells;

a first bit line pair extending along the direction of said columns and connected to said first and second cells in said first memory cell;

a second bit line pair extending along the direction of said columns and connected to said first and second cells in said second memory cell; and a search line pair extending along the direction of said columns, connected to said logical operation cell in each of said first and second memory cells, and transferring said search data.

8. The semiconductor memory device according to claim 7, wherein write of data is collectively carried out on said first and second memory cells in one write cycle.

9. The semiconductor memory device according to claim 7, wherein said first and second memory cells are formed in SOI substrate.

* * * * *